(12) United States Patent
Ota

(10) Patent No.: US 6,872,112 B2
(45) Date of Patent: Mar. 29, 2005

(54) METHOD OF PROCESSING SUBSTRATE, METHOD OF FORMING FILM, AND METHOD AND APPARATUS FOR MANUFACTURING ELECTRON SOURCE

(75) Inventor: Jiro Ota, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 18 days.

(21) Appl. No.: 10/152,827

(22) Filed: May 23, 2002

(65) Prior Publication Data

US 2002/0193034 A1 Dec. 19, 2002

(30) Foreign Application Priority Data

May 28, 2001 (JP) ........................................ 2001-159200
May 20, 2002 (JP) ........................................ 2002-144553

(51) Int. Cl.[7] ........................ H01J 09/00; H01J 09/46; H01J 09/48
(52) U.S. Cl. ............................................ 445/6; 445/24
(58) Field of Search ........................................ 445/6, 24

(56) References Cited

U.S. PATENT DOCUMENTS

| | | | |
|---|---|---|---|
| 4,643,627 A | * | 2/1987 | Bednorz et al. ............ 414/939 |
| 5,622,634 A | | 4/1997 | Noma et al. ................... 216/40 |
| 5,871,587 A | * | 2/1999 | Hasegawa et al. .......... 118/719 |
| 6,083,566 A | * | 7/2000 | Whitesell ..................... 414/940 |
| 6,179,678 B1 | * | 1/2001 | Kishi et al. .................... 445/24 |
| 6,344,711 B1 | | 2/2002 | Ohnishi et al. ............. 313/495 |

FOREIGN PATENT DOCUMENTS

| | | |
|---|---|---|
| JP | 7-235255 | 9/1995 |
| JP | 8-171849 | 7/1996 |

* cited by examiner

*Primary Examiner*—Mariceli Santiago
(74) *Attorney, Agent, or Firm*—Fitzpatrick, Cella, Harper & Scinto

(57) ABSTRACT

To attain an increase in production speed and suitable for mass production in a substrate processing operation such as film formation requiring a hermetic atmosphere. A substrate processing method for performing a predetermined processing on a substrate is provided, which includes the steps of: arranging a surface of the substrate to be processed in a hermetic atmosphere; evacuating said hermetic atmosphere; and performing a predetermined processing on the substrate, in which the processing step is conducted after moving the evacuated hermetic atmosphere from the station for evacuation to a ifferent station.

50 Claims, 15 Drawing Sheets

HERMETICALLY SEALED
CONTAINER UNIT

HERMETICALLY SEALED CONTAINER
UNIT WITH PROBE

METHOD OF PROCESSING SUBSTRATE, METHOD OF FORMING FILM, AND METHOD AND APPARATUS FOR MANUFACTURING ELECTRON SOURCE

BACKGROUND OF THE INVENTION

1. Field of the Invention

The present invention relates to a method of processing a substrate that is performed under a hermetically sealed atmosphere, a method of manufacturing an electron source that is similarly performed under the hermetically sealed atmosphere and an apparatus for manufacturing an electron source.

2. Related Background Art

Conventionally, as an electron-emitting device, there are generally known two types, namely a thermoelectron-emitting device and a cold-cathode electron-emitting device. The cold-cathode electron-emitting device includes a field-emission electron-emitting device, a metal/insulator/metal electron-emitting device, a surface conduction electron-emitting device and the like.

The surface conduction electron-emitting device utilizes the phenomenon in which electron emission is caused by allowing an electric current to flow in a thin film formed with a small area on a substrate and in parallel to the film surface. Its basic structure and manufacturing method are disclosed, for example, in Japanese Patent Application Laid-Open Nos. 7-235255, 8-171849 and the like.

The surface conduction electron-emitting device is characterized by including on a substrate a pair of device electrodes opposing each other and a conductor (electroconductive film) that is connected to the pair of device electrodes and has an electron-emitting region in a part of it. A fissure is formed in a part of the electroconductive film. In addition, a deposited film containing at least one of carbon and carbon compound as a main component is formed at the end of the fissure.

A plurality of such electron-emitting devices are arranged on a substrate and each electron-emitting device is connected by a wiring, whereby an electron source provided with a plurality of surface conduction electron-emitting devices can be manufactured.

In addition, a display panel of an image-display apparatus can be manufactured by combining the above-described electron source with a phosphor.

Conventionally, such a panel of an electron source is manufactured in the following manner. That is, as a first manufacturing method, first, an electron source substrate is manufactured on which a plurality of devices, which consist of an electroconductive film and a pair of device electrodes connected to the electroconductive film, and a wiring connecting the plurality of devices are formed. Next, the entirety of the manufactured electron source substrate is installed in a vacuum chamber. Then, after evacuating the inside of the vacuum chamber, a voltage is applied to the above-described each device through an external terminal to form a fissure in the electroconductive film of each device. Moreover, a gas containing an organic material is introduced into the vacuum chamber and a voltage is applied to the above-described each device again through the external terminal under an atmosphere in which the organic material exists, whereby carbon or carbon compound is caused to deposit in the vicinity of the fissure.

In addition, as a second manufacturing method, first, an electron source substrate is manufactured on which a plurality of devices, which consist of an electroconductive film and a pair of device electrodes connected to the electroconductive film, and a wiring connecting the plurality of devices are formed. Next, the manufactured electron source substrate and a substrate on which a phosphor is disposed are joined together while sandwiching a support frame between them to manufacture a panel of an image-forming apparatus. Thereafter, the inside of the panel is evacuated through an exhaust pipe of the panel and a voltage is applied to the above-described each device through an external terminal of the panel to form a fissure in an electroconductive film of each device. Moreover, a gas containing an organic material is introduced into the panel through the exhaust pipe and a voltage is applied to the above-described each device again through the external terminal under an atmosphere in which the organic material exists, whereby carbon or carbon compound is caused to deposit in the vicinity of the fissure.

The above-described manufacturing methods have been employed in manufacturing a panel of an electron source. However, the first manufacturing method particularly requires a large-size vacuum chamber and an exhaust apparatus coping with high vacuum as the electron source substrate is made larger. In addition, the second manufacturing method requires long time for the evacuation of the space in the panel of the image-forming apparatus and the introduction of the gas containing the organic material into the space in the panel.

SUMMARY OF THE INVENTION

The present invention has been devised in view of the above drawbacks, and it is an object of the present invention to provide a manufacturing apparatus that can be miniaturized and simplified in operability when an electron source is manufactured.

In addition, it is another object of the present invention to provide a method of manufacturing an electron source that can increase a manufacturing speed and is suitable for mass production.

In addition, it is another object of the present invention to provide an apparatus for manufacturing an electron source and a method of manufacturing an electron source that are capable of manufacturing an electron source excellent in an electron-emitting characteristic.

Further, it is yet another object of the present invention to provide a method of processing a substrate and a method of forming a film that can increase a manufacturing speed and are suitable for mass production in substrate processing such as film formation that requires a hermetically sealed atmosphere.

According to the present invention, there is provided a substrate processing method for performing a predetermined processing on a substrate, the method comprising the steps of: arranging a surface of the substrate to be processed in a hermetic atmosphere; evacuating the hermetic atmosphere; and performing a predetermined processing on the substrate, in which the processing step is conducted after moving the evacuated hermetic atmosphere from the station for evacuation to a different station.

According to the present invention, there is provided a film forming method for forming a film on a substrate, the method comprising the steps of: arranging a surface of the substrate on which a film is to be formed in a hermetic atmosphere; evacuating the hermetic atmosphere; and introducing a gas for film formation into the evacuated hermetic atmosphere, in which the gas introducing step is conducted after moving the evacuated hermetic atmosphere from the station for evacuation to a different station.

According to the present invention, there is provided an electron source manufacturing method comprising the steps of: arranging a substrate surface in a hermetic atmosphere; evacuating the hermetic atmosphere; and performing a processing to impart an electron-emitting function to a member arranged on the substrate surface in the evacuated hermetic atmosphere, in which the processing step is conducted after moving the evacuated hermetic atmosphere from the station where the evacuation step is performed to a different station.

According to the present invention, there is provided an electron source manufacturing apparatus comprising: a support member on which a substrate having arranged thereon a conductor with an electron-emitting region formed therein is to be placed; a container covering the conductor; and a conveying means for conveying a hermetically sealed container unit formed by placing the substrate between the support member and the container so as to maintain a desired atmosphere in the container.

BRIEF DESCRIPTION OF THE DRAWINGS

FIGS. 9-1, 9-2, 9-3, 9-4, 9-5, 9-6 and 9-7 illustrate operations of each mechanism of the manufacturing apparatus of FIG. 7;

FIGS. 10-1, 10-2, 10-3, 10-4, 10-5, 10-6, 10-7 and 10-8 illustrate operations of each mechanism of the manufacturing apparatus of FIG. 7;

FIGS. 11-1 and 11-2 illustrate operations of each mechanism of the manufacturing apparatus of FIG. 7;

FIGS. 12-1, 12-2, 12-3, 12-4 and 12-5 illustrate operations of each mechanism of the manufacturing apparatus of FIG. 7.

DESCRIPTION OF THE PREFERRED EMBODIMENTS

Figure 1:
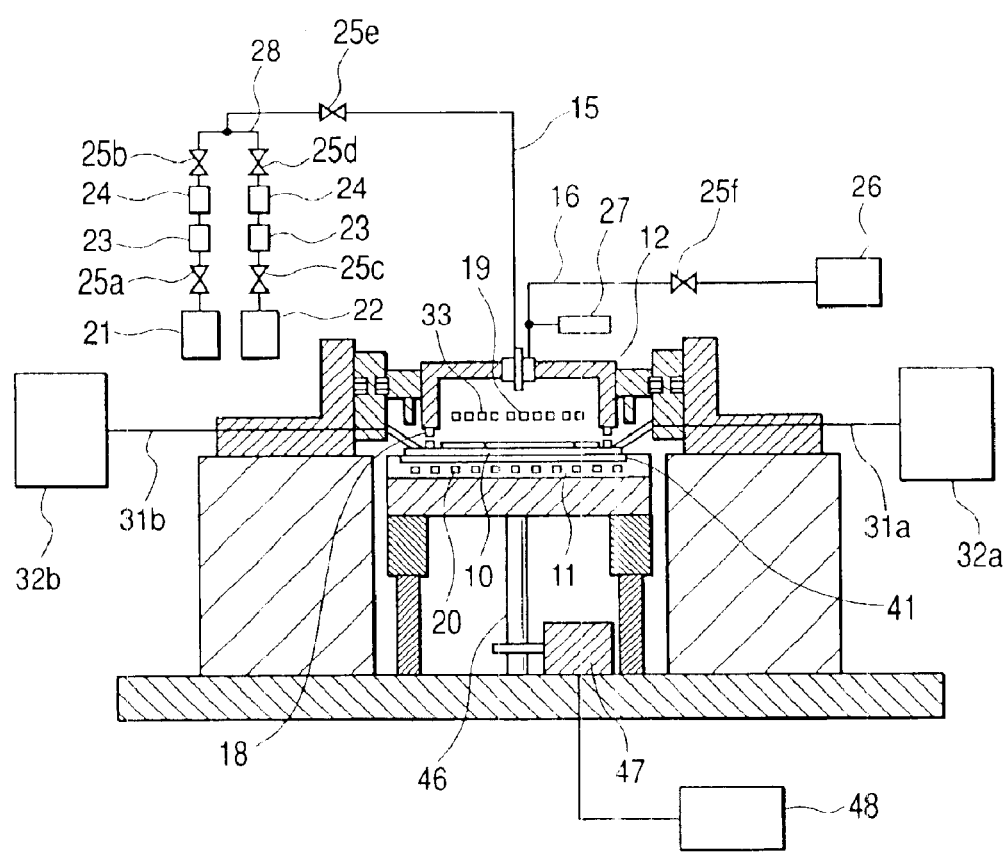
FIG. 1 is a sectional view showing a structure of a form of an apparatus for manufacturing an electron source in accordance with the present invention.

According to the present invention, there is provided a substrate processing method for performing a predetermined processing on a substrate, comprising: a step for arranging a surface of the substrate to be processed in a hermetic atmosphere; an evacuation step for evacuating the hermetic atmosphere; and a processing step for performing a predetermined processing on the substrate, in which the processing step is conducted after moving the evacuated hermetic atmosphere from the station for evacuation to a different station.

In the above substrate processing method, it is preferable that the evacuation step includes a pressure reduction step for reducing the pressure of the hermetic atmosphere, the processing step includes a gas introducing step for introducing a gas into the hermetic atmosphere whose pressure has been reduced, or the evacuation step includes a step for replacing the gas in the hermetic atmosphere.

In the above substrate processing method, it is preferable that the predetermined processing includes one of film formation on the substrate, energization of a conductor arranged on the substrate, reduction of a conductor arranged on the substrate and heating of the substrate.

In the above substrate processing method, it is preferable that the hermetic atmosphere is formed by the substrate and a container arranged on the substrate.

According to the present invention, there is provided a film forming method for forming a film on a substrate, comprising: a step for arranging a surface of the substrate on which a film is to be formed in a hermetic atmosphere; an evacuation step for evacuating the hermetic atmosphere; and a gas introducing step for introducing a gas for film formation into the evacuated hermetic atmosphere, in which the gas introducing step is conducted after moving the evacuated hermetic atmosphere from the station for evacuation to a different station.

In the different station of the above-mentioned film forming method, it is preferable that the gas introducing step and a step for energizing a conductor arranged on the substrate are performed, the gas introducing step and a step for reducing a conductor arranged on the substrate are performed, or the gas introducing step and a step for heating the substrate are performed.

In the above film forming method, it is preferable that the evacuation step includes a pressure reduction step for reducing the pressure of the hermetic atmosphere.

In the above film forming method, it is preferable that the hermetic atmosphere is formed by the substrate and a container arranged on the substrate.

According to the present invention, there is provided an electron source manufacturing method comprising: a step for arranging a substrate surface in a hermetic atmosphere; an evacuation step for evacuating the hermetic atmosphere; and a processing step for performing a processing to impart an electron-emitting function to a member arranged on the substrate surface in the evacuated hermetic atmosphere, in which the processing step is conducted after moving the evacuated hermetic atmosphere from the station where the evacuation step is performed to a different station.

In the above-mentioned electron source manufacturing method, it is preferable that the evacuation step includes a pressure reduction step for reducing the pressure of the hermetic atmosphere, the processing step includes a gas introducing step for introducing a gas for reducing the member into the pressure-reduced hermetic atmosphere, the processing step includes a gas introducing step for introducing hydrogen gas into the pressure-reduced hermetic atmosphere, the processing step includes a gas introducing step for introducing a gas containing a material of a lower work function than the material forming the member into the pressure-reduced hermetic atmosphere, or the processing step includes a gas introducing step for introducing carbon gas or a carbon compound gas into the pressure-reduced hermetic atmosphere.

In the above electron source manufacturing method, it is preferable that the processing step includes one of energization of the member and heating of the member.

In the above electron source manufacturing method, it is preferable that the evacuation step includes replacement of the gas in the hermetic atmosphere.

In the above electron source manufacturing method, it is preferable that the hermetic atmosphere is formed by the substrate and a container arranged on the substrate.

According to the present invention, there is provided an electron source manufacturing apparatus comprising: a support member on which a substrate having arranged thereon a conductor with an electron-emitting region formed therein is to be placed; a container covering the conductor; and a conveying means for conveying a hermetically sealed container unit formed by placing the substrate between the support member and the container so as to maintain a desired atmosphere in the container.

In the above-mentioned electron source manufacturing apparatus, it is preferable that: the apparatus further comprises a voltage applying means for applying to the conductor a voltage for forming an electron-emitting region; the voltage applying means is arranged on the support member; the container has an inlet port and an exhaust port for a gas, and a means for sealing the inlet port and the exhaust port; the apparatus further comprises a plurality of stations through which the hermetically sealed container unit is conveyed and in which steps for manufacturing an electron source are conducted; the apparatus further comprises a voltage applying means for applying a voltage for forming an electron-emitting region to the conductor, in which the voltage applying means is arranged in at least one of the plurality of stations; the container has an inlet port and an exhaust port for a gas, and a means for sealing the inlet port and the exhaust port, and at least one of the plurality of stations has an introducing means or discharging means for a gas detachable with respect to the gas inlet port and the gas exhaust port of the container; or the support member has a chuck mechanism for fixing the substrate to the support member.

Next, preferred embodiment modes of a method of processing a substrate and a method of forming a film of the present invention will be hereinafter described citing a method of manufacturing an electron source and an apparatus for manufacturing an electron source as examples.

Figure 2:
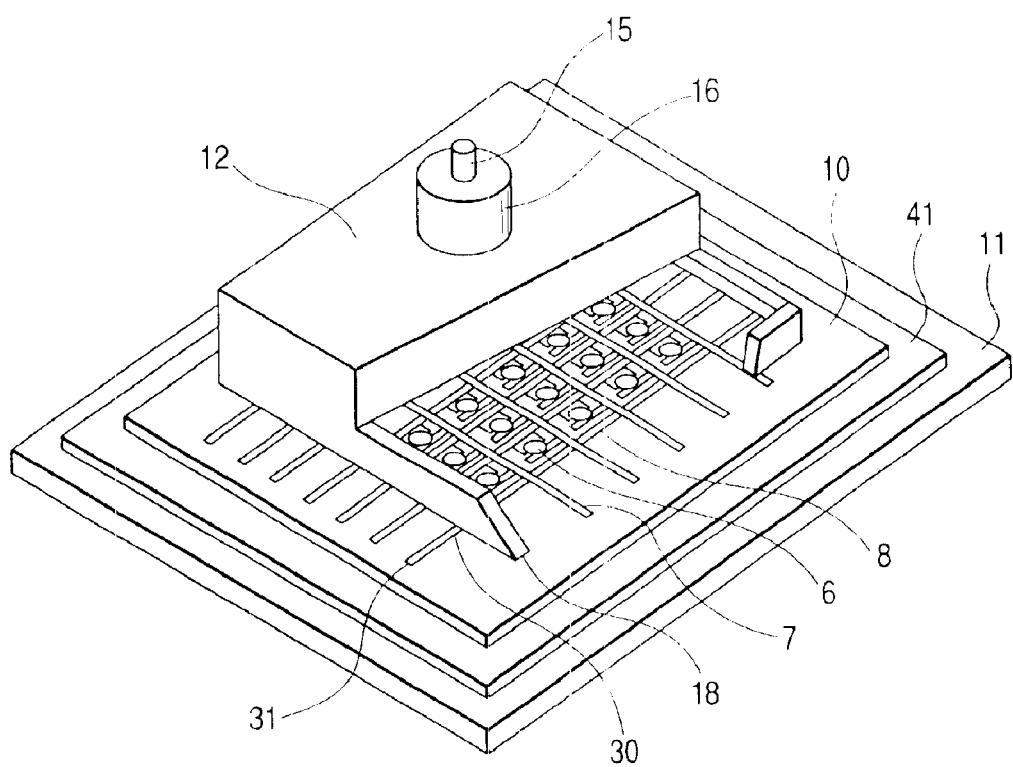
FIG. 2 is a perspective view showing a peripheral part of an electron source substrate in FIGS. 1 and 3 partially cut away.
Figure 3:
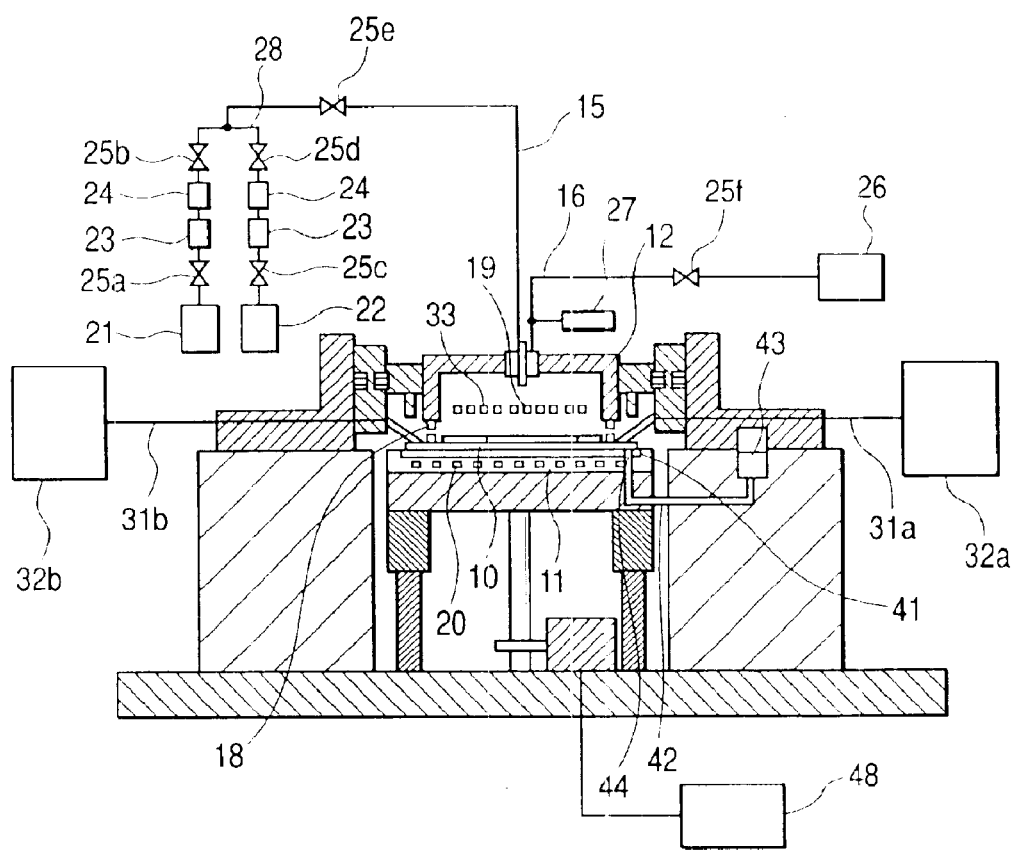
FIG. 3 is a sectional view showing a structure of another form of the apparatus for manufacturing an electron source in accordance with the present invention.

FIGS. 1, 2 and 3 show an apparatus for manufacturing an electron source in accordance with this embodiment mode. FIGS. 1 and 3 are sectional views showing the entire apparatus and FIG. 2 is a perspective view showing a peripheral part of an electron source substrate of FIG. 1. In FIGS. 1, 2 and 3, reference numeral 6 denotes a conductor to be an electron-emitting device, 7 denotes X-directional wirings, 8 denotes Y-directional wirings, 10 denotes an electron source substrate, 11 denotes a support member, 12 denotes a vacuum container, 15 denotes a gas inlet port, 16 denotes an exhaust port, 18 denotes a seal member, 19 denotes a diffusion plate, 20 denotes a heater, 21 denotes a hydrogen or organic material gas, 22 denotes a carrier gas, 23 denotes moisture removing filters, 24 denotes gas flow rate control devises, 25a to 25f denote valves, 26 denotes a vacuum pump, 27 denotes a vacuum gauge, 28 denotes piping, 30 denotes extraction wirings, 31 (31a, 31b) denotes wirings for connecting the extraction wirings 30 of the electron source substrate and drivers 32, 32 (32a, 32b) denotes drivers consisting of power sources and current control systems, 33 denotes openings of the diffusion plate 19, 41 denotes a heat conduction member, 46 denotes an ascending/descending shaft, 47 denotes an ascending/descending driving unit for ascending/descending the support member 11 and 48 denotes an ascending/descending control device for controlling ascending/descending of the support member 11. Gas introducing means is constituted by the hydrogen or organic material gas 21, the carrier gas 22, the moisture removing filter 23, the gas flow rate control devices 24, the valves 25a to 25e and the piping 28. Gas exhausting means is constituted by the valve 25f, the vacuum pump 26 and the vacuum gauge 27.

The support member 11 is for holding to fix the electron source substrate 10 and has a mechanism for mechanically fixing the electron source substrate 10 by a vacuum chucking mechanism, an electrostatic chucking mechanism, a fixing jig or the like. The heater 20 is provided inside the support member 11, which can heat the electron source substrate 10 via the heat conduction member 41, if necessary.

The heat conduction member 41 may be nipped between the support member 11 and the electron source substrate 10 or may be installed to be embedded in the support member 11 such that it does not hinder the mechanism for holding to fix the electron source substrate 10 from working.

The heat conduction member 41 can absorb warp and undulation of the electron source substrate 10, surely transmit heat, which is generated in an electric processing process applied to the electron source substrate 10, to the support member or a secondary vacuum container and release the heat, prevent cracks and breakage of the electron source substrate 10 from occurring and contribute to improvement of a yield.

In addition, by quickly and surely releasing the heat generated in the electric processing process the heat conduction member 41 can contribute to decrease of a concentration distribution of an introduced gas due to a temperature distribution in the vacuum container 12 and decrease of nonuniformity of devices affected by a heat distribution of a substrate. As a result, it becomes possible to manufacture an electron source excellent in uniformity.

As the heat conduction member 41, a viscous liquid material such as silicon grease, silicon oil and a gel material can be used. If the heat conduction member 41, which is a viscous liquid material, has a harmful effect of moving on the support member 11, in order to have the viscous liquid material held up in a predetermined position and area, that is, at least below an area where the conductor 6 of the electron source substrate 10 is formed, a holding-up mechanism may be installed in the support member 11 in alignment with the area. For example, the heat conduction member 41 may be constituted by providing an O-ring to hold up the viscous liquid material or by putting the viscous liquid material in a heat resistant bag and hermetically sealing it.

In the case in which the viscous liquid material is held up on the support member 11 by providing an O-ring or the like, if the viscous liquid material does not correctly contact the electron source substrate 10 due to an air layer formed between them, a through hole for letting out air may be provided or a method of injecting the viscous liquid material into the part between the substrate and the support member after installing the electron source substrate 10 can be employed. FIG. 3 is a schematic sectional view of an apparatus in which the support member 11 is provided with an O-ring (not shown) and a viscous liquid material inlet port 42 such that the viscous liquid material is held up in a predetermined area. As shown in the figure, the viscous liquid material is introduced onto the support member 11 from a viscous liquid material storing portion 43 via a viscous liquid material introducing pipe 44.

If this viscous liquid material is nipped between the support member 11 and the electron source substrate 10 and a mechanism for circulating it while performing temperature control is given to it, the viscous liquid material functions as heating means or cooling means of the electron source substrate 10 in place of the heater 20. In addition, a mechanism consisting of, for example, a circulation temperature adjusting device, a liquid medium and the like, which can perform temperature adjustment with respect to a target temperature, can be given to it.

The heat conduction member 41 may be an elastic member. As a material for the elastic member, a synthetic resin material such as Teflon resin, a rubber material such as silicon rubber, a ceramic material such as alumina, a metal material such as copper or aluminum, and the like can be used. These may be used in a sheet form or a divided sheet form. Alternatively, a projection-like body such as a cylindrical body, a columnar body including a prismatic body, a liner body extending in an X direction or a Y direction in alignment with the wirings of the electron source substrate 10 and a conical body, a spherical body such as a sphere and a Rugby ball-like body (elliptical sphere), a spherical body of a shape having projections formed on a surface thereof, or the like, may be provided on the support member 11.

The vacuum container 12 is a container made of glass, stainless steel, titanium, copper, aluminum or aluminum honeycomb. If possible, it is preferable that it is made of a material with less gas emission. The vacuum container 12 covers an area in which the conductor 6 is formed excluding an extraction wiring part of the electron source substrate 10 and has a structure that can resist at least a pressure ranging from $10^{-6}$ Pa to the atmospheric pressure.

The seal member 18 is for maintaining hermetically sealed property of the electron source substrate 10 and the vacuum container 12. An O-ring, a rubber sheet and the like are used as the seal member 18.

As the organic material (or hydrogen) gas 21, an organic material used for activation of an electron-emitting device discussed below or a mixed gas of an organic material diluted by nitrogen, helium, argon or the like is used. In addition, in performing energization operation of forming discussed below, a gas for promoting formation of a fissure in an electroconductive film constituting the conductor 6, for example, a hydrogen gas or the like having a reducing property may be introduced into the vacuum container 12. In introducing a gas in a separate process in this way, the gas can be used if introducing piping and the valve member 25e are used to connect the vacuum container 12 to the piping 28.

The organic material used for the activation of the above-described electron-emitting device includes aliphatic hydrocarbons such as alkane, alkene or alkyne, aromatic hydrocarbons, alcohols, aldehydes, ketones, amines, nitrites, phenol and organic acids such as carboxylic acid, or sulfonic acid. More specifically, saturated hydrocarbon expressed by $C_nH_{2n+2}$ such as methane, ethane or propane, unsaturated hydrocarbon expressed by composition formula: $C_nH_{2n}$ or the like such as ethylene and propylene, benzene, toluene, methanol, ethanol, acetaldehyde, acetone, methylethylketone, methylamine, ethylamine, phenol, benzonitrile, acetonitrile, etc. may be employed.

The organic gas 21 is used as it is if the organic material is a gas at the normal temperature. If the organic material is a liquid or a solid at the normal temperature, the organic gas 21 can be evaporated or sublimated in a container to be used or can be used by employing a method of further mixing the evaporated or sublimated gas with a dilution gas, or the like. As the carrier gas 22, inert gases such as nitrogen, argon and helium are used.

The organic material gas 21 and the carrier gas 22 are mixed at a fixed ratio and introduced into the vacuum container 12. Flow rates and a mixing ratio of these gases are controlled by the gas flow rate control devices 24. The gas flow rate control devices 24 are constituted by mass-flow controllers, electromagnetic valves and the like. The mixed gas is heated to an appropriate temperature by a heater (not shown) provided in the vicinity of the piping 28, if necessary, and, then, introduced into the vacuum container 12 from the inlet port 15. A temperature for heating the mixed gas is preferably equal to a temperature of the electron source substrate 10.

In addition, it is more preferable that the moisture removing filters 23 are provided in the middle of the piping 28 to remove moisture in the introduced gas. As the moisture removing filter 23, a moisture absorbent such as silica gel, molecular sieve and magnesium hydroxide can be used.

The mixed gas introduced into the vacuum container 12 is exhausted at a fixed exhaust speed by the vacuum pump 26 through the exhaust port 16, whereby a pressure of the mixed gas in the vacuum container 12 is maintained constant. The vacuum pump 26 used in the present invention is a pump for high vacuum such as a dry pump, a diaphragm pump, a scroll pump and a cryo pump. An oil-free pump is preferably used.

In this embodiment mode, although depending on a type of an organic material used for activation, it is preferable in terms of reduction of time of the activation process and improvement of uniformity that the pressure of the mixed gas is equal to or higher than a pressure under which a mean free path $\lambda$ of gas molecules forming the mixed gas becomes sufficiently smaller than a size of the inside of the vacuum container 12. This is a so-called viscous flow region, which has a pressure in the range of several hundreds of Pa (several Torr) to the atmospheric pressure.

In addition, it is preferable to provide the diffusion plate 19 between the gas inlet port 15 of the vacuum container 12 and the electron source plate 10 because a flow of a mixed gas is controlled and an organic material is supplied to the entire surface of the substrate uniformly, whereby uniformity of an electron-emitting device is improved.

The extraction wirings 30 of an electron source substrate are provided outside the vacuum container 12 and connected to the wiring 31 using TAB wirings and probes to be further connected to the driver 32.

The apparatus can be miniaturized because it is sufficient for the vacuum container 12 to cover only the conductor 6 on the electron source substrate 10. This advantage is common to this embodiment mode and embodiments discussed below. In addition, since the extraction wirings 30 of the electron source substrate 10 are arranged outside the vacuum container 12, the electron source substrate 10 and the power source device (driver 32) for performing electric processing can be electrically connected easily.

A pulse voltage is applied to each electron-emitting device on the substrate 10 through the wiring 31 using the driver 32 in the state in which a mixed gas containing an organic material is caused to flow into the vacuum container 12 in the manner described above, whereby activation of the electron-emitting device can be performed.

Specific examples of the method of manufacturing an electron source using the manufacturing apparatus described above will be described in detail in the following embodiments.

Figure 4:
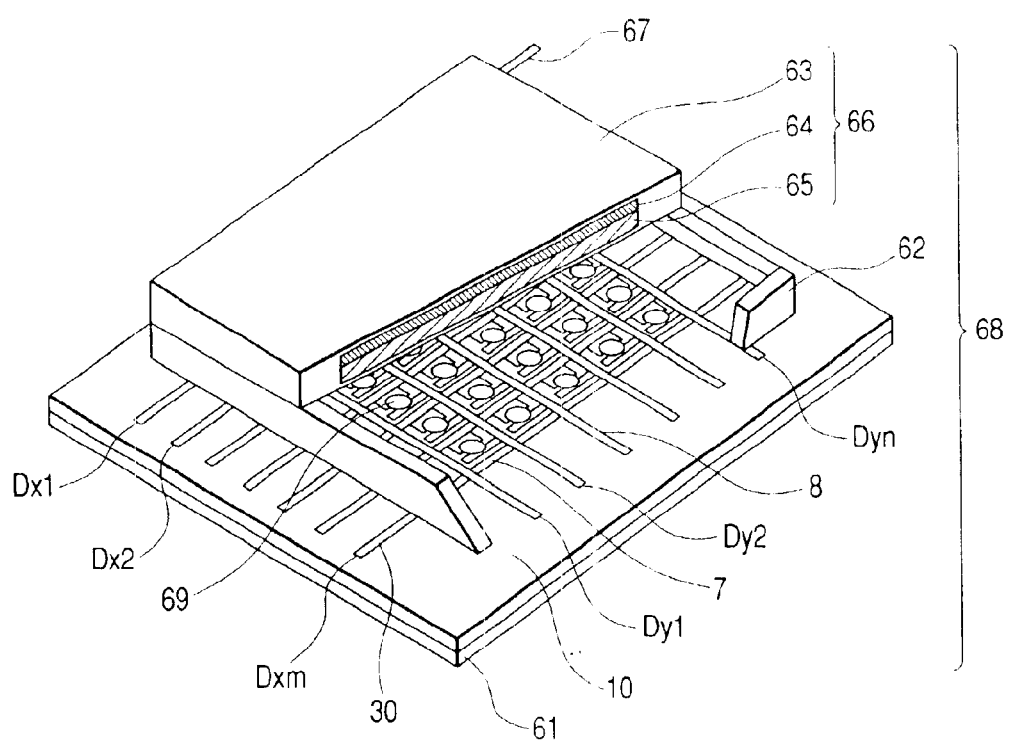
FIG. 4 is a view showing a form of an image-forming apparatus manufactured by the present invention.

By combining the above-described electron source and an image-forming member, an image-forming apparatus as shown in FIG. 4 can be formed. FIG. 4 is a schematic view of the image-forming apparatus. In FIG. 4, reference numeral 69 denotes electron-emitting devices, 61 denotes a rear plate on which the electron source substrate 10 is fixed, 62 denotes a support member, 66 denotes a face plate consisting of the glass substrate 63, the metal back 64 and a phosphor 65, 67 denotes a high voltage terminal and 68 denotes an image-forming apparatus.

In the image-forming apparatus 68, a scanning signal and a modulation signal are applied to each electron-emitting device 69 by signal generating means (not shown), respectively, through terminals external to a container Dx1 to Dxm and Dy1 to Dyn, whereby the electron-emitting device is caused to emit electrons. In addition, a high voltage of 5 kV is applied to the metal back 64 or a transparent electrode (not shown) through the high voltage terminal 67, electron beams were accelerated and caused to collide with the phosphor 65 of a film shape and the phosphor is caused to be excited and emit light, whereby an image is displayed.

In addition, the electron source substrate 10 may function as and form the rear plate of itself. In addition, the scanning signal wirings may be one-sided scanning wirings as shown in FIG. 4 as long as, for example, the number of devices is not so large that there is no influence of applied voltage drop between electron-emitting devices close to the terminals external to a container of Dx1 and electron-emitting device distant therefrom. However, if the number of devices is large and there is influence of voltage drop, a measure can be taken such as the one for increasing a width of the wiring, increasing a thickness of the wiring or applying a voltage from the both sides.

In particular, in this embodiment mode, a production system is employed in which a forming process for forming a fissure in a conductor (electroconductive film) of the foregoing each device is separated from an activation process for causing carbon or carbon compound to deposit in the vicinity of the fissure, and an electron source substrate mounted on the foregoing support member can be fed one by one in the interval between the processes. Thus, the production system in accordance with this embodiment mode increases the number of apparatuses in the processes that take long and makes it possible to manufacture an electron source in short time as an entire manufacturing line, thereby solving a problem that manufacturing of a substrate takes extremely long which is caused by performing each process in turn by one apparatus as in the conventional apparatus.

Therefore, the apparatus of this embodiment is characterized by the following points: the apparatus has a support member for supporting a substrate on which a conductor is formed and a container that has an inlet port of a gas and an exhaust port of a gas and covers an area of a part of the surface of the foregoing substrate; the foregoing substrate, the foregoing support member and the foregoing container are formed as a hermetically sealed container unit as a whole in the state in which the foregoing substrate is held between the foregoing support member and the foregoing container; and a throttle valve mechanism is provided in the foregoing container, which performs vacuum evacuation in the state in which the foregoing substrate is held between the foregoing support member and the foregoing container to maintain the vacuum state.

EMBODIMENTS

Specific embodiments of the present invention will now be described in detail. These embodiments, however, should not be construed restrictively. Replacement of elements and design changes are possible without departing from the scope of the invention allowing achievement of the object thereof.

Embodiment 1

As an example of the substrate processing method or film forming method of the present invention, this embodiment presents a method and apparatus for manufacturing an electron source, by means of which an electron source equipped with a plurality of surface conduction electron-emitting devices is produced.

Figure 5:
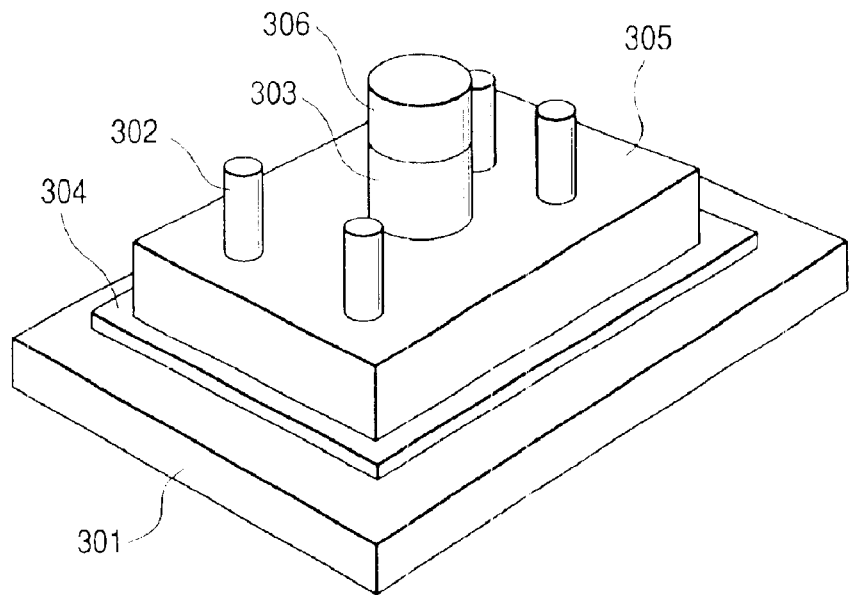
FIG. 5 is a perspective view showing a hermetically sealed container unit in accordance with a first embodiment of the present invention.

FIG. 5 is a diagram illustrating a hermetically sealed container unit related to the manufacturing apparatus of this embodiment. Regarding the general construction of the manufacturing apparatus, it is the same as that of the above-described one, so that a description thereof will be omitted. In FIG. 5, numeral 301 indicates a support member supporting a substrate 304 with a conductor formed thereon, numeral 302 indicates an inlet port for introducing a gas for forming and activation into a container 305, numeral 303 indicates a gas exhaust port for evacuating the interior of the container 305, numeral 304 indicates the substrate with a conductor formed thereon, numeral 305 indicates the container for covering a part of the substrate surface, and numeral 306 indicates a throttle valve mechanism provided on top of the gas exhaust port 303 and serving to maintain the vacuum in the container 305.

In the hermetically sealed container unit, constructed as described above, a gas discharging means is connected to the gas exhaust port 303 (and the throttle valve mechanism 306) and a heating plate is connected to the lower portion of the support member to thereby evacuate the interior of the container 305; then, a gas introducing means is connected to the inlet port 302, and, instead of the above-mentioned heating plate, a cooling plate is connected, and further, a means for applying voltage to the conductor is connected to the conductor portion of the substrate 304 supported by the support member 301 to effect energization, whereby it is possible to prepare the electron source of the electron source substrate 304 and perform activation of the electron-emitting device superior in electron emission property.

Further, by reducing the size and weight of the hermetically sealed container unit and enabling it to move while maintaining the vacuum in the container 305, it is possible to establish, instead of a single self-contained apparatus, a line-type production line easy to keep tact balance, making it possible to achieve a reduction in production line space and a significant reduction in manufacturing apparatus cost in producing the same amount of products.

Embodiment 2

Figure 6:
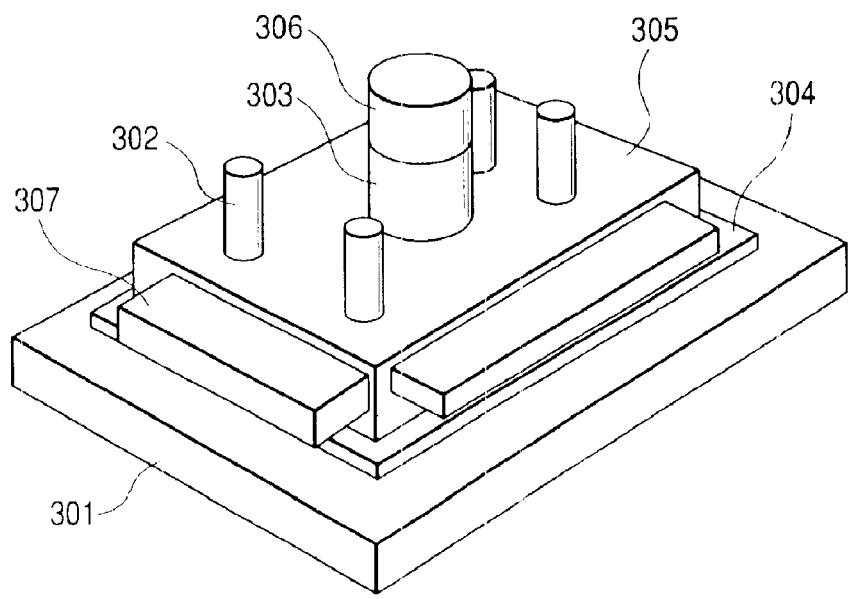
FIG. 6 is a perspective view showing a hermetically sealed container unit in accordance with a second embodiment of the present invention.

FIG. 6 is a diagram illustrating a second embodiment of the present invention. The drawing illustrates a hermetically sealed container unit in a manufacturing apparatus according to this embodiment. This embodiment is the same as Embodiment 1 except for the probe unit 307 and its periphery.

In the drawing, numeral 301 indicates a support member supporting a substrate 304 with a conductor formed thereon, numeral 302 indicates inlet port for introducing a gas for forming and activation into a container 305, numeral 303 indicates a gas exhaust port for evacuating the interior of the container 305, numeral 304 indicates the substrate with a conductor formed thereon, numeral 305 indicates the container for covering a part of the substrate surface, numeral 306 indicates a throttle valve mechanism provided on top of the gas exhaust port 303 and serving to maintain the vacuum in the container 305, and numeral 307 indicates a probe unit serving as a means for applying voltage to a conductive portion of the substrate 304 with a conductor formed thereon.

By mounting the probe unit 307 to the periphery of the container 305, it is only necessary to perform positioning once on the container 305 with respect to the substrate 304 with the conductor formed thereon and effect vacuum connection before the container 305 including the probe unit 307 for applying voltage to the conductive portion of the substrate 304 can move integrally with the support member 301, whereby the degree of freedom in the formation of the production line increases, and it is possible to achieve a further reduction in the cost of the manufacturing apparatus.

Embodiment 3

This embodiment relates to a vacuum processing method and a film formation method, which will be described in detail below with reference to an electron source manufacturing apparatus.

Figure 7:
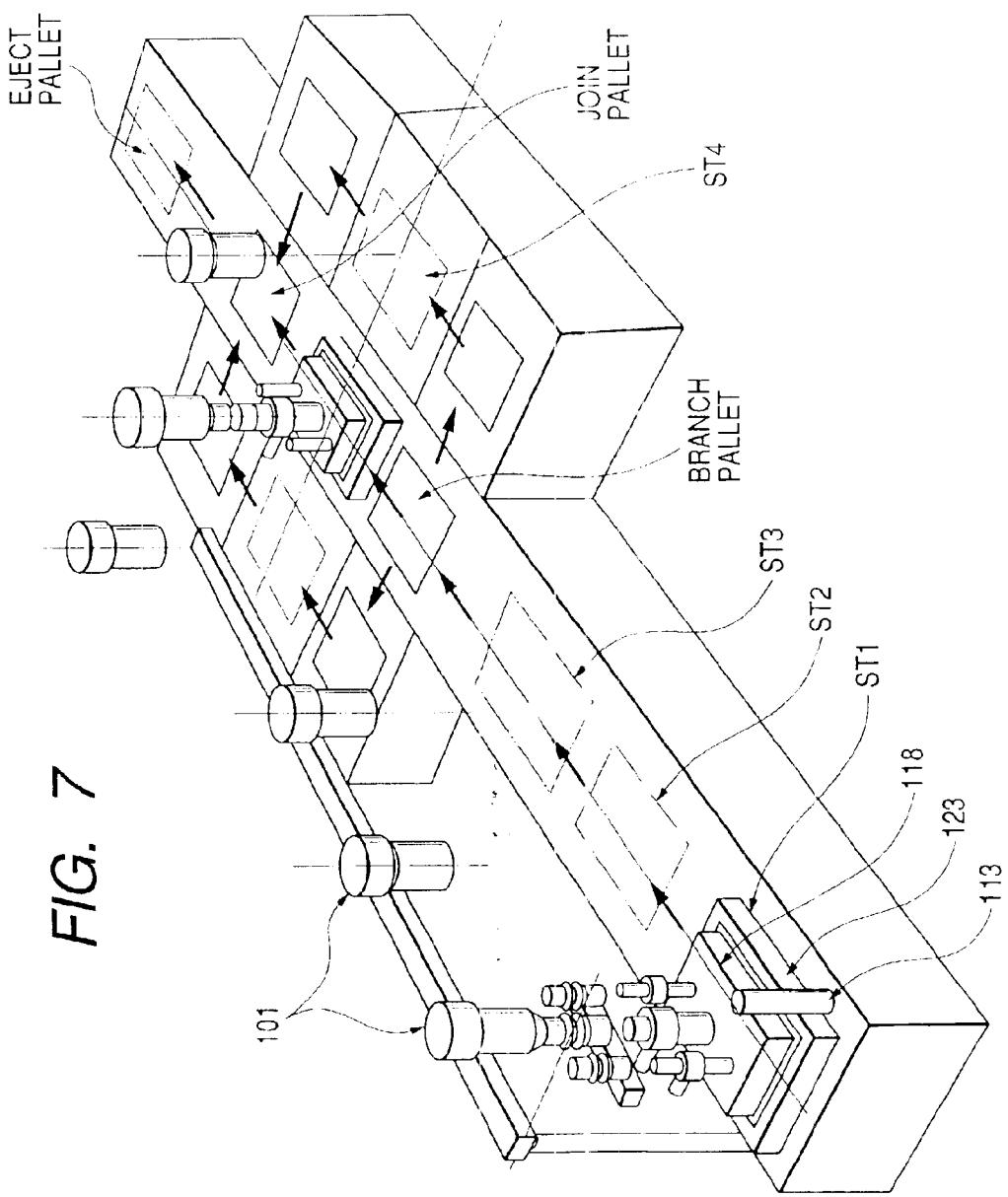
FIG. 7 is a view showing a form of an apparatus for manufacturing an electron source.

FIG. 7 shows a line-type electron source manufacturing apparatus, in which a plurality of stations for performing various processings on a substrate are arranged in a line-like fashion, the substrate being conveyed between the plurality of stations. In the manufacturing apparatus shown in FIG. 7, a pressure reduction operation station ST1, a forming operation station ST2, a gas replacement operation station ST3, and an activation operation station ST4 are arranged in a line-like fashion, the substrate to be processed being successively conveyed between the processing stations. Each of the above-mentioned stations is equipped with a processing mechanism.

Figure 8:
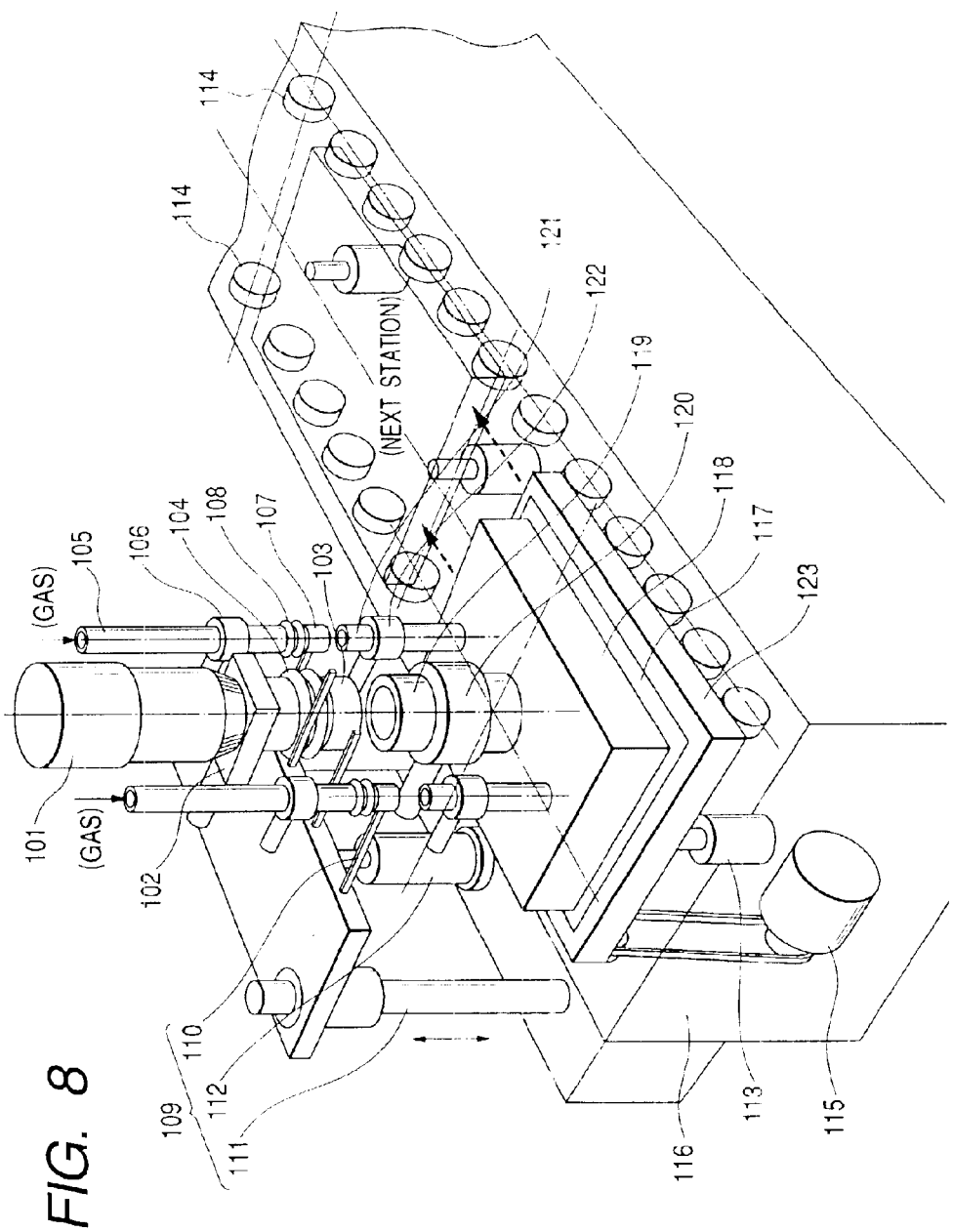
FIG. 8 is a view showing an example of a station of the manufacturing apparatus of FIG. 7.

FIG. 8 shows an example of the stations. Numeral 101 indicates a vacuum pump for evacuation, numeral 102 indicates an opening/closing valve provided on the vacuum pump 101 side, numeral 103 indicates a vertically movable short connection pipe, numeral 104 indicates a hermetic expansion pipe connecting the vertical movable short connection pipe 103 to the vacuum pump 101, numeral 105 indicates a gas introducing pipe connected to a gas source (not shown), numeral 106 indicates an opening/closing valve on the gas source side, numeral 107 indicates a vertically movable short connection pipe, numeral 108 indicates a hermetic expansion pipe connecting the vertically movable short connection pipe 107 to the gas source, and numeral 109 indicates an ascending/descending unit for causing the short connection pipes 103 and 107 to ascend and descend, the ascending/descending unit being equipped with a short connection pipe retaining member 110, an ascending/descending guide post 111, and an ascending/descending drive cylinder 112. Numeral 113 indicates a positioning unit for adjusting a pallet retaining a substrate to be processed to a predetermined position on a station, numeral 114 indicates a conveyance roller for conveying a pallet retaining a substrate to be processed to a different station, numeral 115 indicates a driving system for a conveyance roller 114, and numeral 116 indicates an apparatus base.

The substrate 117 to be processed is conveyed with at least the region to be processed being maintained in a hermetic atmosphere. In view of this, as shown in FIG. 8, a hood 118 is arranged on the substrate 117 to be processed. Further, in order to achieve a reduction pressure or create a predetermined gas atmosphere in the hermetic atmosphere formed by the substrate 117 to be processed and the hood 118, the hood 118 is equipped with a connection pipe 119 connected to the vacuum pump 101 of the station, an opening/closing valve 120 provided in the connection pipe 119, a connection pipe 121 connected to the gas source of the station, and an opening/closing valve 122 provided in the connection pipe 121. Further, the substrate 117 to be processed with the hood 118 arranged thereon is arranged on a pallet 123 containing an electrostatic chuck and heating means and, in some cases, a cooling means, and is conveyed in this state. As to the pallet 123, the means for holding the substrate in close contact with the pallet is not restricted to an electrostatic chuck; for example, it may also be a means for mechanically pulling the substrate to the pallet side.

Next, the operation of the mechanisms of the above-described electron source manufacturing apparatus will be specifically described with reference to an electron source manufacturing process.

Figure 13:
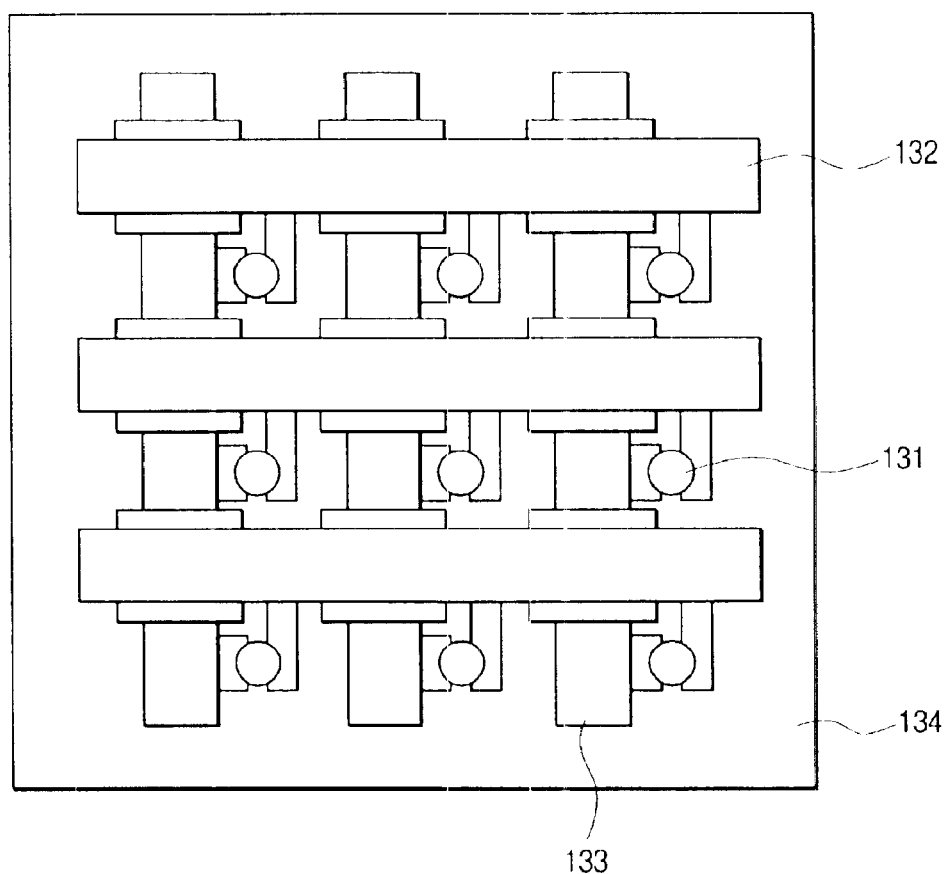
FIG. 13 is a view showing an example of a substrate to be processed.

As the substrate to be processed, a substrate 130 as shown in FIG. 13 is prepared, in which a plurality of conductive films 131 are arranged in a matrix by a plurality of row-direction wirings 132 and a plurality of column-direction wirings 133 which are insulated from each other.

The substrate 130 is arranged on the pallet 123, and the hood (container) 118 is arranged on the substrate 130 so as to cover the plurality of conductive films 131 shown in FIG. 13. At this time, although not shown in FIG. 13, an extraction wiring is connected to each of the plurality of row-direction wirings 132, and the hood (container 118) is arranged excluding a partial region of the substrate 130 so that part of the extraction wirings may be positioned in the exterior of the hood 118 (i.e., in the atmospheric air).

First, the pallet 123 is conveyed to the pressure reduction operation station ST1 shown in FIG. 7. Of the mechanisms described with reference to FIG. 8, the pressure reduction operation station ST1 is equipped with all the mechanisms except for the gas introducing pipe 105 connected to the gas source, the opening/closing valve 106 on the gas source side, the vertically movable short connection pipe 107, and the hermetic expansion pipe 108 connecting the vertically movable short connection pipe 107 to the gas source.

Figures 3, 9:
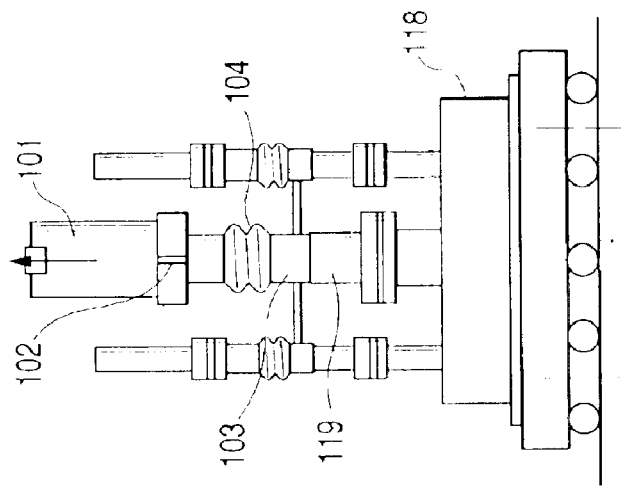
Figures 2, 9:
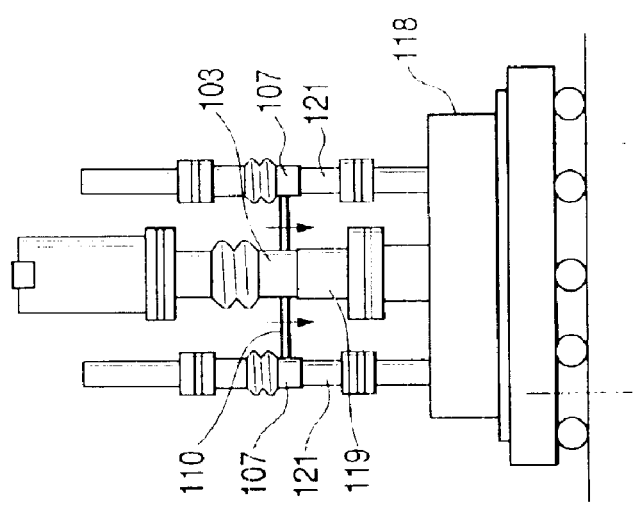
Figures 1, 9:
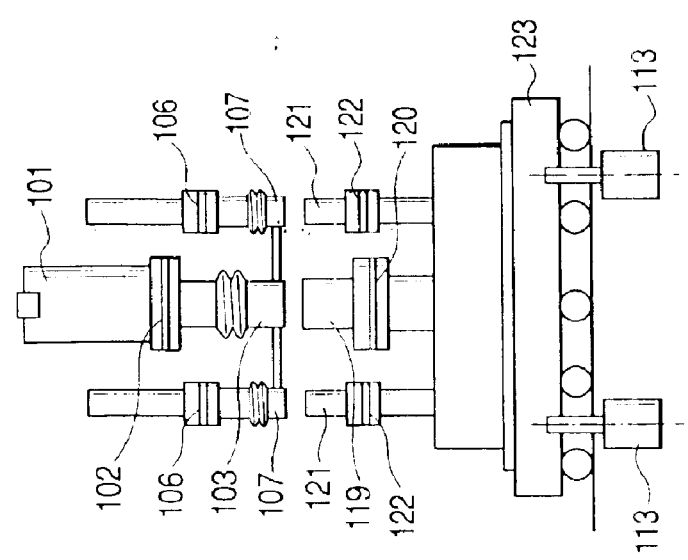
Figures 4, 9:
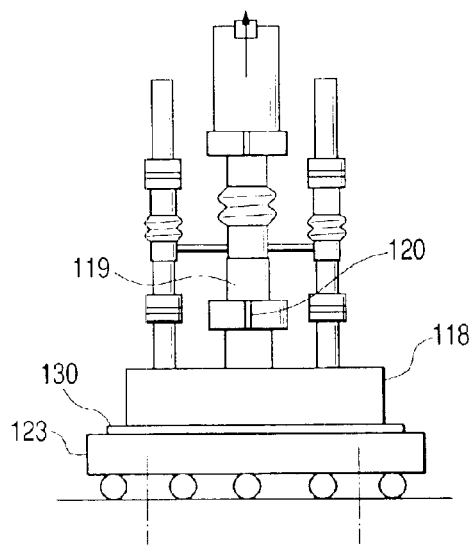
Figures 5, 9:
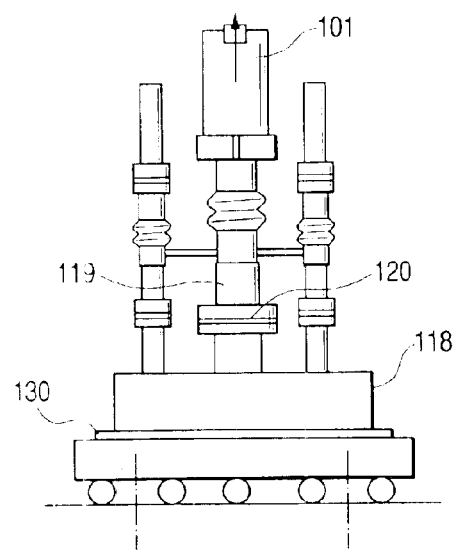
Figures 6, 9:
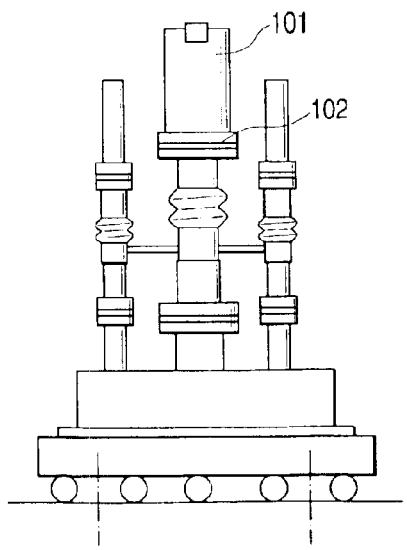
Figures 7, 9:
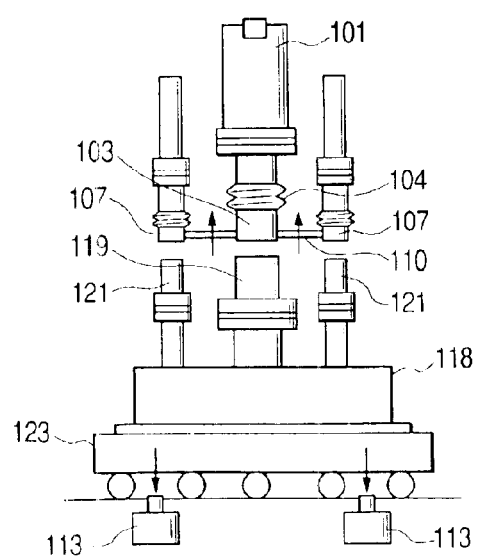

[ST1-1] The pallet 123 is conveyed to the pressure reduction operation station ST1 shown in FIG. 7, and positioning is performed on the connection pipes 119 and 121 on the hood 118 side and the short connection pipes 103 and 107 on the pressure reduction station ST1 side, the positioning and fixation being effected by the positioning unit 113 (FIG. 9-1). The opening/closing valves 102, 106, 120, and 122 are always in the closed state.

[ST1-2] The short connection pipe ascending/descending unit of the pressure reduction operation station ST1 is operated. By driving the ascending/descending drive cylinder 112 consisting of an air cylinder or the like, the short connection pipes 103 and 107 retained by the retaining member 110 descend along the ascending/descending guide post 111, and are respectively connected to the connection pipes 119 and 121 on the hood 118 side (FIG. 9-2). Hermetic seal members are arranged in the portions where the short connection pipes 103 and 107 are connected to the connection pipes 119 and 121.

[ST1-3] In synchronism with the opening of the opening/closing valve 102 on the pressure reduction operation station ST1 side, the vacuum pump 101 is operated to start evacuation (FIG. 9-3), whereby the interior of the short connection pipe 103 and the expansion pipe 104 on the pressure reduction operation station ST1 side and the interior of the connection pipe 119 on the hood 118 side are evacuated.

[ST1-4] After performing electrostatic chucking of the substrate 130 to the pallet 123, the opening/closing valve 120 provided in the connection pipe 119 on the hood 118 side is opened, whereby evacuation is started on the hermetic atmosphere formed by the substrate 130 and the hood 118 (FIG. 9-4).

[ST1-5] When the hermetic atmosphere formed by the substrate 130 and the hood 118 has been evacuated to $10^{-4}$ Pa, the opening/closing valve 120 provided in the connection pipe 119 on the hood 118 side is closed (FIG. 9-5). At this stage, the vacuum pump 101 on the pressure reduction operation station ST1 side continues to operate.

[ST1-6] Next, the opening/closing valve 102 on the pressure reduction operation station ST1 side is closed, and, in synchronism therewith, the vacuum pump 101 is stopped (FIG. 9-6).

[ST1-7] An atmosphere-releasing leak valve (not shown) provided in the piping connected to the vacuum pump 101 on the pressure reduction station ST1 side is opened, and the interior of the short connection pipe 103 and the expansion pipe 104 on the pressure reduction operation station ST1 side and the interior of the connection pipe 119 on the hood 118 side are restored to the atmospheric pressure before the short connection pipe ascending/descending unit 109 of the pressure reduction operation station ST1 is operated. By driving the ascending/descending drive cylinder 112, the short connection pipes 103 and 107 retained by the retaining member 110 ascend along the ascending/descending guide post 111, and are detached from the connection pipes 119 and 121 on the hood 118 side. Thereafter, the positioning/fixation of the pallet 123 by the positioning unit 113 is canceled (FIG. 9-7).

Next, the pallet 123 is conveyed to the forming operation station ST2. The forming operation station ST2 is equipped with the same mechanisms as those of the pressure reduction operation station ST1 described above. Further, it is equipped with the gas introducing pipe 105 connected to the gas source, the opening/closing valve 106 on the gas source side, the vertically movable short connection pipe 107, and the hermetic expansion pipe 108 connecting the vertically movable short connection pipe 107 to the gas source, described above with reference to FIG. 8, a gas for forming operation being used for the gas source. Further, there is provided a probe unit for supplying electricity to the extraction wirings on the substrate 130 exposed on the outer side of the hood 118. The conveyance is effected with the substrate 130 being electrostatically chucked to the pallet 123.

Figures 1, 10:
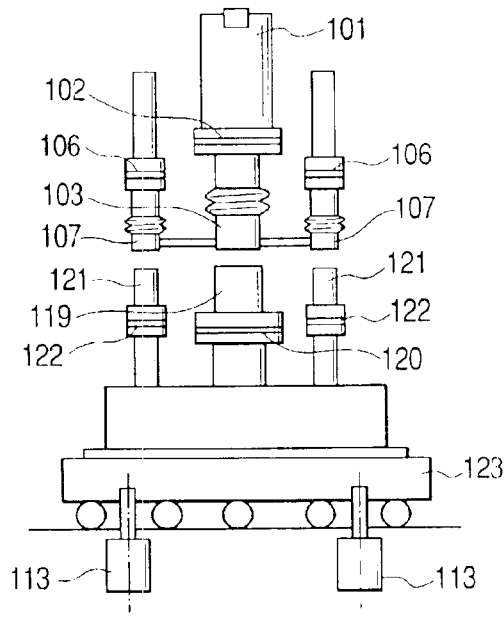
Figures 2, 10:
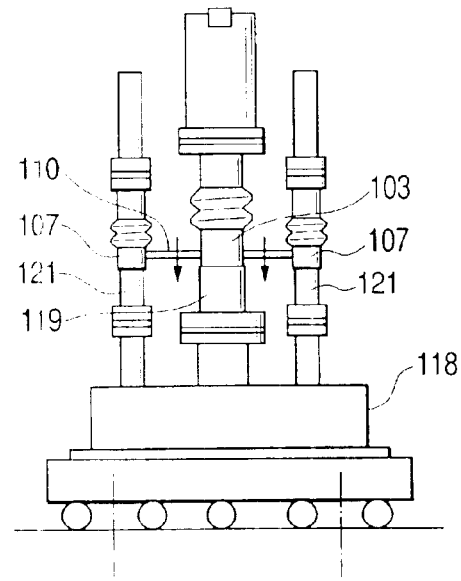
Figures 3, 10:
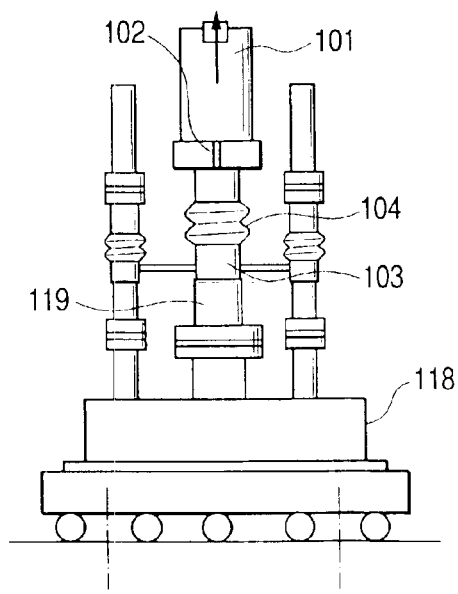
Figures 4, 10:
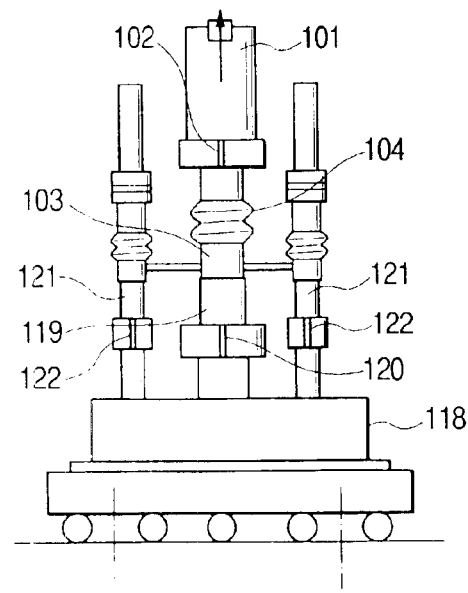
Figures 5, 10:
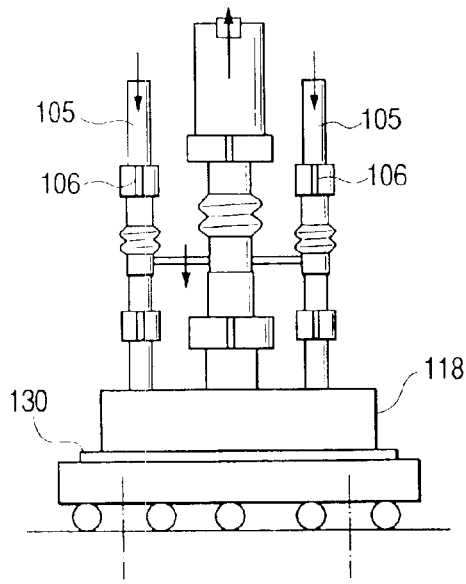
Figures 6, 10:
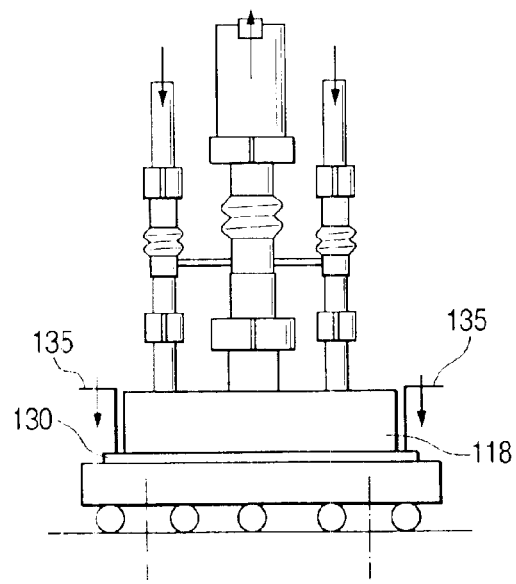
Figures 7, 10:
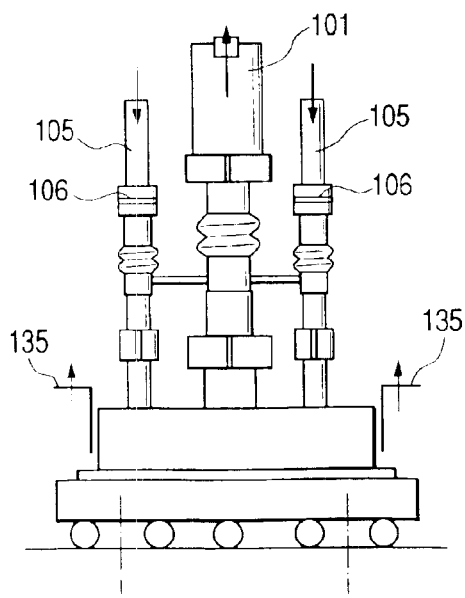
Figures 8, 10:
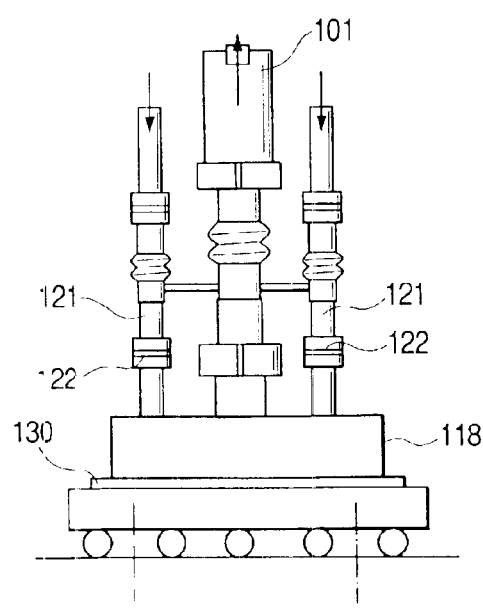

[ST2-1] After conveying the pallet 123 to the forming operation station ST2 by the conveyance roller 114 and its driving system 115, positioning and fixation is effected by the positioning unit 113 as in [ST1-1] (FIG. 10-1).

[ST2-2] Next, as in [ST1-2], the short connection pipes 103 and 107 retained by the retaining member 110 on the forming operation station ST2 side are respectively connected to the connection pipes 119 and 121 on the hood 118 side (FIG. 10-2).

[ST2-3] As in [ST1-3], evacuation is started (FIG. 10-3).

[ST2-4] The opening/closing valves 120 and 122 provided in the connection pipes 119 and 121 on the hood 118 side are opened (FIG. 10-4).

[ST2-5] When the hermetic atmosphere formed by the substrate 130 and the hood 118 has been evacuated to $10^{-4}$ Pa, the opening/closing valve 106 provided in the gas introducing pipe 105 on the forming operation station ST2 side is opened, and the introduction of a mixture gas consisting of 2% of hydrogen (reduction gas) and 98% of nitrogen and serving as the forming gas into the hermetic atmosphere is started (FIG. 10-5).

[ST2-6] When the pressure in the hermetic atmosphere formed by the substrate 130 and the hood 118 has reached 1000 Pa, the probe unit 135 of the forming operation station ST2 is lowered to be brought into contact with the extraction wirings, and a pulse voltage of a predetermined crest value, pulse width, and pulse interval is applied to the plurality of conductive films on the substrate 130 through the extraction wirings (FIG. 10-6). At this time, the substrate 130 is heated by the heating means contained in pallet. This heating of the substrate 130 is effected for the purpose of promoting the reduction or cohesion of the plurality of conductive films on the substrate 130 or making the temperature of the whole substrate even. Thus, the forming operation consists in applying voltage to a plurality of conductive films to form gaps (fissures) in the plurality of conductive films.

[ST2-7] After a predetermined period of time, the opening/closing valve 106 provided in the gas introducing pipe 105 on the forming operation station ST2 side is closed, and the introduction of the forming gas into the hermetic atmosphere is stopped, and, in synchronism therewith, the application of voltage by the probe unit 135 is stopped (FIG. 10-7). Further, the probe unit 135 is raised and detached from the extraction wirings. The evacuation by the vacuum pump 101 on the forming operation station ST2 side is continued.

[ST2-8] When the hermetic atmosphere formed by the substrate 130 and the hood 118 has been evacuated to $10^{-4}$ Pa, the opening/closing valve 122 provided in the connection pipe 121 on the hood 118 side is closed (FIG. 10-8). The evacuation by the vacuum pump 101 on the forming operation station ST2 side is continued.

From this onward, as in [ST1-5] through [ST1-7], the short connection pipes 103 and 107 on the forming operation station ST2 side are detached from the connection pipes 119 and 121 on the hood 118 side, and, thereafter, the positioning/fixation of the pallet 123 by the positioning unit 113 is canceled (FIGS. 9-5 through 9-7).

Next, the pallet 123 is conveyed to a gas replacement operation station ST3. The gas replacement operation station ST3 is equipped with the same mechanisms as those of the forming operation station ST2, and an activation operation gas is used for the gas source. Examples of the activation operation gas include a gas containing a material of lower work function than the material constituting the conductive film, carbon gas, and a carbon compound gas. The conveyance is effected with the substrate 130 electrostatically chucked to the pallet 123.

The gas replacement operation herein is a processing in which the gas to be used in the activation operation (activation operation gas) is previously introduced into the hermetic atmosphere formed by the substrate 130 and the hood 118. The gas replacement operation may be conducted simultaneously with the activation operation in the activation operation station ST4. Thus, this station is not indispensable to this electron source manufacturing apparatus.

First, the pallet 123 is conveyed to the gas replacement operation station ST3, and processes similar to those of the above-described [ST2-1] through [ST2-4] were performed (FIGS. 10-1 through 10-4).

Figures 1, 11:
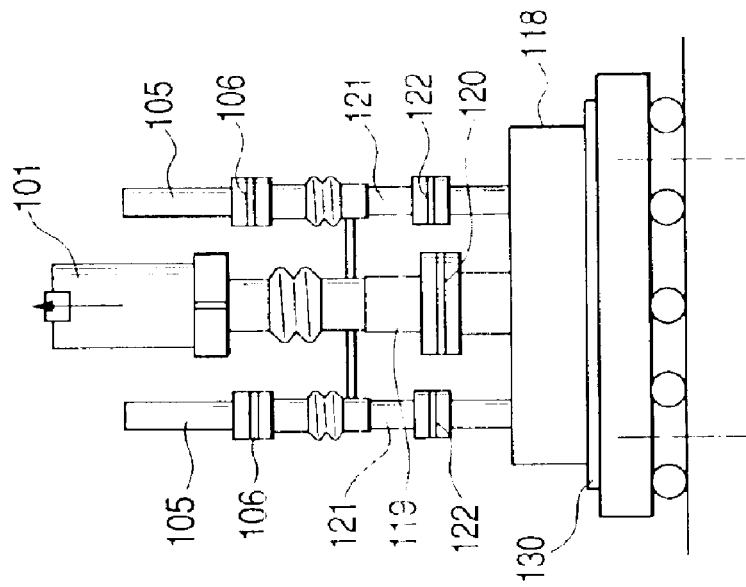
Figures 2, 11:
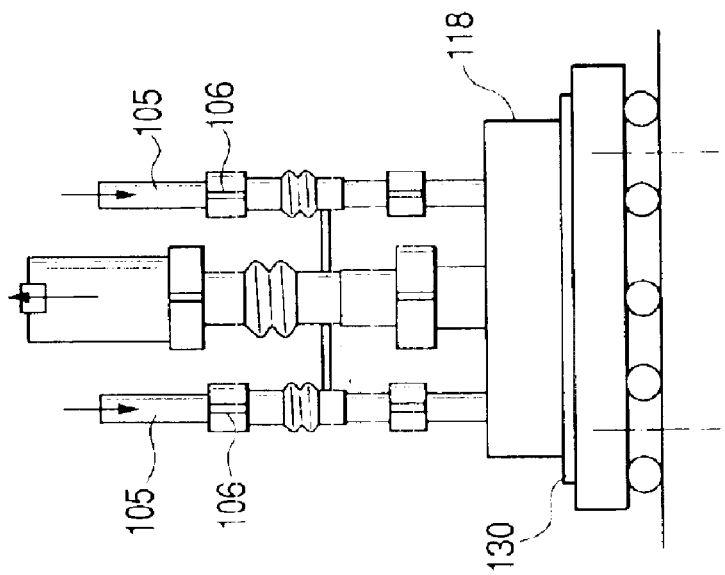

[ST3-5] Therefore, when the hermetic atmosphere formed by the substrate 130 and the hood 118 has been evacuated to $10^{-5}$ Pa, the opening/closing valve 106 provided in the gas introducing pipe 105 on the gas replacement operation station ST3 side is opened, and the introduction of tolunitrile serving as the activation operation gas into the hermetic atmosphere is started (FIG. 11-1).

[ST3-6] The above-mentioned activation operation gas was introduced into the hermetic atmosphere formed by the substrate 130 and the hood 118 to a partial pressure of $1\times10^{-3}$ Pa, and then the opening/closing valve 106 provided in the gas introducing pipe 105 on the gas replacement operation station ST3 side is closed. Subsequently, the opening/closing valves 120 and 122 provided in the connection pipes 119 and 121 on the hood 118 side are closed (FIG. 11-2). The evacuation by the vacuum pump 101 on the gas replacement operation station ST3 side is continued.

From this onward, as in [ST1-5] through [ST1-7], the connection pipes 119 and 121 on the hood 118 side are detached from the short connection pipes 103 and 107 on the gas replacement operation station ST3 side. Thereafter, the positioning/fixation of the pallet 123 by the positioning unit 113 is canceled (FIG. 9-5 through 9-7).

Next, the pallet 123 is conveyed to the activation operation station ST4. The activation operation station ST4 is equipped with the same mechanisms as those of the forming operation station ST2, and an activation operation gas is used for the gas source. The conveyance is effected with the substrate 130 electrostatically chucked to the pallet 123.

With the current state of the art, the activation operation takes longer time than the processing in each of the above stations. Thus, from the viewpoint of achieving an improvement in productivity, it is desirable to provide a plurality of activation operation stations ST4 as shown in FIG. 13.

First, the pallet 123 is conveyed to the activation operation station ST4, and processes similar to the above [ST2-1] through [ST2-3] are conducted (FIGS. 10-1 through 10-3).

Figures 1, 12:
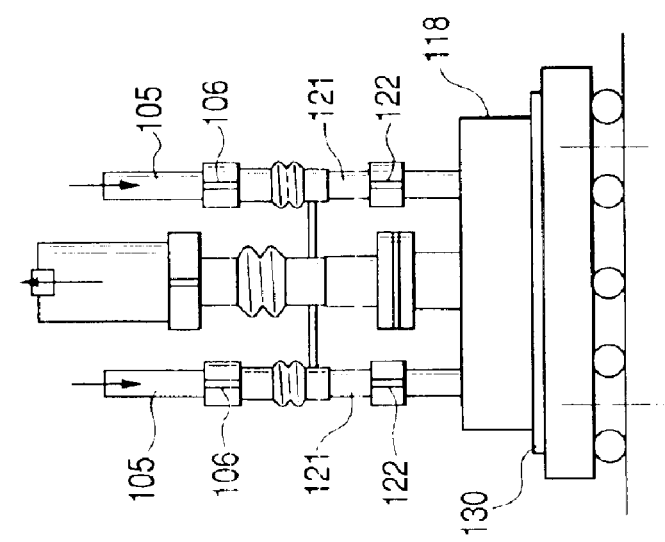
Figures 2, 12:
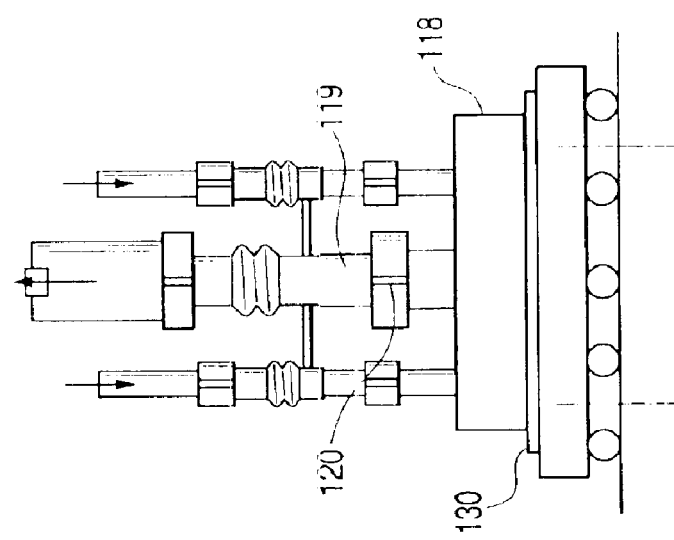
Figures 3, 12:
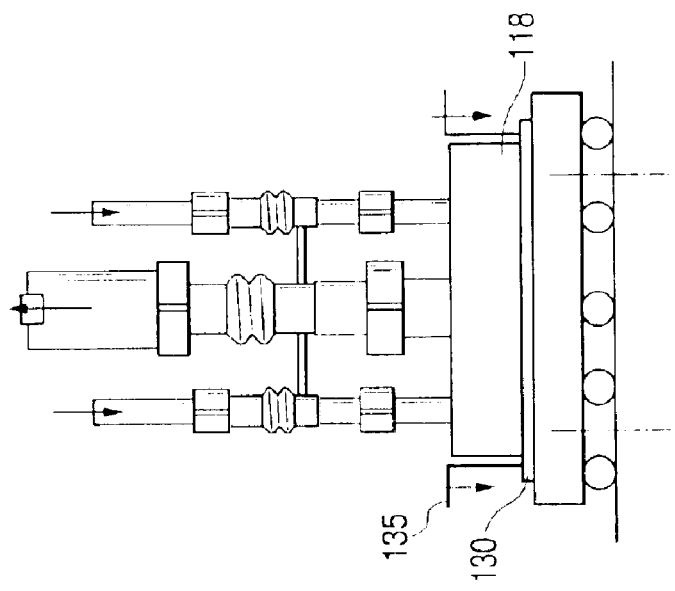
Figures 4, 12:
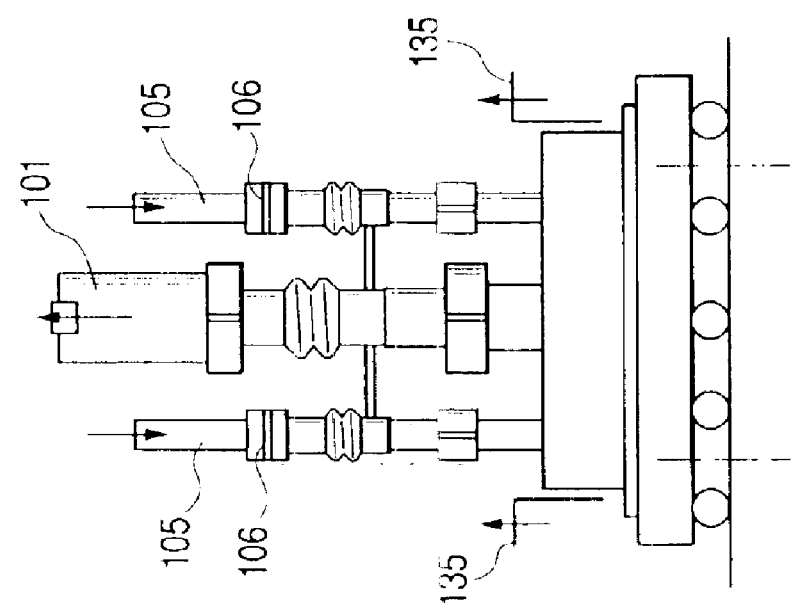
Figures 5, 12:
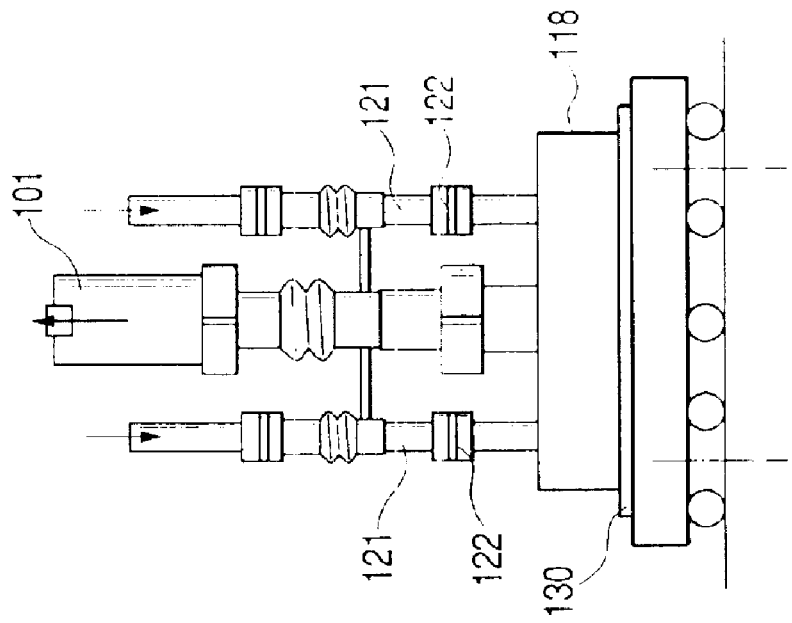

[ST4-4] The opening/closing valve 106 provided in the gas introducing pipe 105 on the activation operation station ST4 side and the opening/closing valve 122 provided in the connection pipe 121 provided on the hood 118 side are opened, and the introduction of the activation operation gas into the hermetic atmosphere formed by the substrate 130 and the hood 118 is started (FIG. 12-1). As in the gas replacement operation, tolunitrile is used as the activation operation gas.

[ST4-5] The opening/closing valve 120 provided in the connection pipe 119 on the hood 118 side is opened, and the partial pressure of the activation operation gas in the hermetic atmosphere formed by the substrate 130 and the hood 118 is maintained at $1\times10^{-3}$ Pa (FIG. 12-2).

[ST4-6] The probe unit 135 of the activation operation station ST4 is lowered to be brought into contact with the extraction wirings, and a pulse voltage of a predetermined crest value, pulse width, and pulse interval is applied to the plurality of conductive films on the substrate 130 through the extraction wirings (FIG. 12-3). At this time, as in the above-described forming operation, the substrate 130 is heated by the heating means contained in the pallet. Here, the activation operation is performed for the purpose of forming a film of carbon or carbon compound on the plurality of conductive films on the substrate 130.

[ST4-7] After a predetermined period of time, the opening/closing valve 106 provided in the gas introducing pipe 105 on the activation operation station ST4 side is closed, and the introduction of the activation operation gas into the hermetic atmosphere is stopped, and, in synchronism therewith, the application of voltage by the probe unit 135 is stopped. Further, the probe unit 135 is raised and detached from the extraction wirings (FIG. 12-4). The evacuation by the vacuum pump 101 on the activation operation station ST4 side is continued.

[ST4-8] When the hermetic atmosphere formed by the substrate 130 and the hood 118 has been evacuated to $10^{-6}$ Pa, the opening/closing valve 122 provided in the connection pipe 121 on the hood 118 side is closed (FIG. 12-5). The evacuation by the vacuum pump 101 on the activation operation station ST4 side is continued.

From this onward, as in [ST1-5] through [ST1-7], the short connection pipes 103 and 107 on the activation operation station ST4 side are detached from the connection pipes 119 and 121 on the hood 118 side, and, thereafter, the positioning/fixation of the pallet 123 by the positioning unit 113 is canceled (FIGS. 9-5 through 9-7).

The operation of each mechanism in the activation operation station ST4 when there is no gas replacement operation station ST3 is as follows.

The pallet 123 is conveyed from the above-mentioned forming operation station ST2 to the activation operation station ST4 by the conveyance roller 114 and the driving system 115 thereof, and then processes similar to [ST2-1] through [ST2-4] are conducted (FIGS. 10-1 through 10-4).

[ST4-5] When the hermetic atmosphere formed by the substrate 130 and the hood 118 has been evacuated to $10^{-5}$ Pa, the opening/closing valve 106 provided in the gas introducing pipe 105 on the activation operation station ST4 side is opened, and the introduction of tolunitrile serving as the activation operation gas into the hermetic atmosphere is started (FIG. 10-5).

[ST4-6] After the partial pressure of the tolunitrile in the hermetic atmosphere formed by the substrate 130 and the hood 118 has reached $1\times10^{-3}$ Pa, the probe unit 135 of the activation operation station ST4 is lowered and brought into contact with the extraction wirings to apply a pulse voltage of a predetermined crest value, pulse width, and pulse interval to the plurality of conductive films on the substrate 130 through the extraction wirings (FIG. 10-6).

[ST4-7] After a predetermined period of time, the opening/closing valve 106 provided in the gas introducing pipe 105 on the activation operation station ST4 side is closed, and the introduction of the activation operation gas into the hermetic atmosphere is stopped, and, in synchronism therewith, the application of voltage by the probe unit 135 is stopped. Further, the probe unit 135 is raised and detached from the extraction wirings (FIG. 10-7). The evacuation by the vacuum pump 101 on the activation operation station ST4 side is continued.

[ST4-8] When the hermetic atmosphere formed by the substrate 130 and the hood 118 has been evacuated to $10^{-6}$ Pa, the opening/closing valve 122 provided in the connection pipe 121 on the hood 118 side is closed (FIG. 10-8). The evacuation by the vacuum pump 101 on the activation operation station ST4 side is continued.

From this onward, as in [ST1-5] through [ST1-7], the short connection pipes 103 and 107 on the activation operation station ST4 side are detached from the connection pipes 119 and 121 on the hood 118 side, and, thereafter, the positioning/fixation of the pallet 123 by the positioning unit 113 is canceled (FIGS. 9-5 through 9-7).

After it has passed the above-described stations of the electron source manufacturing apparatus, the pallet 123 is discharged from the apparatus, and the electrostatic chucking is canceled with the hood 118 being removed. After this, positioning is performed on the substrate 130 with respect to a substrate on which phosphor and metal back are arranged, and seal bonding is performed thereon before it is incorporated into a display panel whose interior has a degree of vacuum of approximately $10^{-6}$ Pa. Further, a driving circuit, etc. are mounted on this display panel to thereby produce a display device.

In accordance with the above-described embodiment, a step particularly requiring long time is divided into a plurality of steps, and there are provided a plurality of stations in which these steps are performed; by effecting movement of the substrate with a predetermined hermetic atmosphere maintained, it is possible to process a large number of substrates efficiently.

In particular, when it is necessary to process the substrate in a predetermined atmosphere, steps requiring long time, such as exhaust and gas introduction, are needed for forming the atmosphere. In such cases, this embodiment proves more effective.

In accordance with the present invention, it is possible to provide an electron source manufacturing apparatus which helps to achieve a reduction in production cost and allows a reduction in size and simplification in operation.

Further, in accordance with the present invention, it is possible to provide an electron source manufacturing apparatus which helps to attain an increase in production speed and which is suitable for mass production.

Further, in accordance with the present invention, it is possible to provide an electron source manufacturing apparatus capable of producing an electron source superior in electron-emitting characteristic.

Further, in accordance with the present invention, it is possible to provide an image forming apparatus superior in image quality.

Further, in accordance with the present invention, it is possible to provide a substrate processing method and film forming method helping to attain an increase in production speed and suitable for mass production in a substrate processing operation such as film formation requiring a hermetic atmosphere.

What is claimed is:

1. A substrate processing method for performing a predetermined processing on a substrate,
   the method comprising the steps of:
   arranging a surface of the substrate to be processed in a hermetic atmosphere;
   evacuating said hermetic atmosphere; and
   performing a predetermined processing by energizing a conductor arranged on the substrate in the evacuated hermetic atmosphere,
   wherein said energizing step is conducted after moving the substrate together with the evacuated hermetic atmosphere from the station for evacuation to a different station.

2. A substrate processing method for performing a predetermined processing on a substrate,
   the method comprising the steps of:
   arranging a surface of the substrate to be processed in a hermetic atmosphere;
   evacuating said hermetic atmosphere; and
   performing a predetermined processing by reducing a conductor arranged on the substrate in the evacuated hermetic atmosphere,
   wherein said reducing step is conducted after moving the substrate together with the evacuated hermetic atmosphere from the station for evacuation to a different station.

3. A substrate processing method according to claim 1 or claim 2, wherein said evacuation step includes a pressure reduction step for reducing the pressure of the hermetic atmosphere.

4. A substrate processing method according to claim 3, wherein said processing step includes a gas introducing step for introducing a gas into the hermetic atmosphere whose pressure has been reduced.

5. A substrate processing method according to claim 1 or claim 2, wherein said evacuation step includes a step for replacing the gas in the hermetic atmosphere.

6. A substrate processing method according to claim 1 or claim 2, wherein said predetermined processing further includes film formation on said substrate.

7. A substrate processing method according to claim 1 or claim 2, wherein said predetermined processing further includes heating of said substrate.

8. A film forming method for forming a film on a substrate, comprising the steps of:
   arranging a surface of the substrate on which a film is to be formed in a hermetic atmosphere;
   evacuating said hermetic atmosphere; and
   introducing a gas for film formation into the evacuated hermetic atmosphere,
   wherein said gas introducing step is conducted after moving the substrate together with the evacuated hermetic atmosphere from the station for evacuation to a different station, wherein, in said different station, said gas introducing step and a step for energizing a conductor arranged on the substrate are performed.

9. A film forming method for forming a film on a substrate, comprising the steps of:
   arranging a surface of the substrate on which a film is to be formed in a hermetic atmosphere;
   evacuating said hermetic atmosphere; and
   introducing a gas for film formation into the evacuated hermetic atmosphere,
   wherein said gas introducing step is conducted after moving the substrate together with the evacuated hermetic atmosphere from the station for evacuation to a different station, wherein, in said different station, said gas introducing step and a step for reducing a conductor arranged on the substrate are performed.

10. A film forming method according to claim 8 or claim 9, wherein, in said different station, a further step of heating said substrate is performed.

11. A film forming method according to claim 8 or claim 9, wherein the evacuation step includes a pressure reduction step for reducing the pressure of said hermetic atmosphere.

12. An electron source manufacturing method comprising the steps of:
   arranging a substrate surface in a hermetic atmosphere;
   evacuating said hermetic atmosphere; and
   performing a processing to impart an electron-emitting function to a member arranged on the substrate surface in the evacuated hermetic atmosphere,
   wherein said processing step is conducted after moving the substrate together with the evacuated hermetic atmosphere from the station where said evacuation step is performed to a different station.

13. An electron source manufacturing method according to claim 12, wherein said evacuation step includes replacement of the gas in said hermetic atmosphere.

14. An electron source manufacturing method according to claim 12, wherein said evacuation step includes a pressure reduction step for reducing the pressure of said hermetic atmosphere.

15. An electron source manufacturing method according to claim 14, wherein said processing step includes a gas introducing step for introducing a gas for reducing said member into the pressure-reduced hermetic atmosphere.

16. An electron source manufacturing method according to claim 14, wherein said processing step includes a gas introducing step for introducing hydrogen gas into the pressure-reduced hermetic atmosphere.

17. An electron source manufacturing method according to claim 14, wherein said processing step includes a gas introducing step for introducing a gas containing a material of a lower work function than the material forming said member into the pressure-reduced hermetic atmosphere.

18. An electron source manufacturing method according to claim 14, wherein said processing step includes a gas introducing step for introducing carbon gas or a carbon compound gas into the pressure-reduced hermetic atmosphere.

19. An electron source manufacturing method according to one of claims 12 through 18, wherein said processing step includes energization of said member.

20. An electron source manufacturing method according to one of claims 12 through 18, wherein said processing step includes heating of said member.

21. An electron source manufacturing apparatus comprising:
   a support member on which a substrate having arranged thereon a conductor with an electron-emitting region formed therein is to be placed;
   a container covering said conductor; and
   a conveying means for conveying a hermetically sealed container unit formed by placing said substrate between said support member and said container so as to maintain a desired atmosphere in said container.

22. An electron source manufacturing apparatus according to claim 21, further comprising a voltage applying means for applying to said conductor a voltage for forming an electron-emitting region.

23. An electron source manufacturing apparatus according to claim 22, wherein the voltage applying means is arranged on the support member.

24. An electron source manufacturing apparatus according to claim 21, wherein said container has an inlet port and an exhaust port for a gas, and a means for sealing the inlet port and the exhaust port.

25. An electron source manufacturing apparatus according to claim 21, further comprising a plurality of stations through which said hermetically sealed container unit is conveyed and in which steps for manufacturing an electron source are conducted.

26. An electron source manufacturing apparatus according to claim 25, further comprising a voltage applying means for applying a voltage for forming an electron-emitting region to said conductor, wherein said voltage applying means is arranged in at least one of said plurality of stations.

27. An electron source manufacturing apparatus according to claim 25, wherein said container has an inlet port and an exhaust port for a gas, and a means for sealing the inlet port and the exhaust port, and wherein at least one of said plurality of stations has an introducing means or discharging means for a gas detachable with respect to the gas inlet port and the gas exhaust port of said container.

28. An electron source manufacturing apparatus according to one of claims 21 through 27, wherein said support member has a chuck mechanism for fixing said substrate to the support member.

29. A substrate processing method for performing a predetermined processing on a substrate,
   the method comprising the steps of:
   arranging a surface of the substrate to be processed in a hermetic atmosphere formed by the substrate and a container arranged on the substrate;
   evacuating said hermetic atmosphere; and
   performing a predetermined processing on the substrate in the evacuated hermetic atmosphere,
   wherein said processing step is conducted after moving the substrate together with the evacuated hermetic atmosphere from the station for evacuation to a different station.

30. A substrate processing method according to claim 29, wherein said evacuation step includes a pressure reduction step for reducing the pressure of the hermetic atmosphere.

31. A substrate processing method according to claim 30, wherein said processing step includes a gas introducing step for introducing a gas into the hermetic atmosphere whose pressure has been reduced.

32. A substrate processing method according to claim 29, wherein said evacuation step includes a step for replacing the gas in the hermetic atmosphere.

33. A substrate processing method according to claim 29, wherein said predetermined processing includes film formation on said substrate.

34. A substrate processing method according to claim 29, wherein said predetermined processing includes energization of a conductor arranged on said substrate.

35. A substrate processing method according to claim 29, wherein said predetermined processing includes reduction of a conductor arranged on said substrate.

36. A substrate processing method according to claim 29, wherein said predetermined processing includes heating of said substrate.

37. A film forming method for forming a film on a substrate, comprising the steps of:
   arranging a surface of the substrate on which a film is to be formed in a hermetic atmosphere formed by the substrate and a container arranged on the substrate;
   evacuating said hermetic atmosphere; and
   introducing a gas for film formation into the evacuated hermetic atmosphere,
   wherein said gas introducing step is conducted after moving the evacuated hermetic atmosphere from the station for evacuation to a different station.

38. A film forming method according to claim 37, wherein, in said different station, said gas introducing step and a step for energizing a conductor arranged on the substrate are performed.

39. A film forming method according to claim 37, wherein, in said different station, said gas introducing step and a step for reducing a conductor arranged on the substrate are performed.

40. A film forming method according to claim 37, wherein, in said different station, said gas introducing step and a step for heating said substrate are performed.

41. A film forming method according to claim 37, wherein the evacuation step includes a pressure reduction step for reducing the pressure of said hermetic atmosphere.

42. An electron source manufacturing method comprising the steps of:
   arranging a substrate surface in a hermetic atmosphere formed by the substrate and a container arranged on the substrate;

evacuating said hermetic atmosphere; and performing a processing to impart an electron-emitting function to a member arranged on the substrate surface in the evacuated hermetic atmosphere, wherein said processing step is conducted after moving the evacuated hermetic atmosphere from the station where said evacuation step is performed to a different station.

43. An electron source manufacturing method according to claim 42, wherein said processing step includes energization of said member.

44. An electron source manufacturing method according to claim 42, wherein said processing step includes heating of said member.

45. An electron source manufacturing method according to one claim 42, wherein said evacuation step includes replacement of the gas in said hermetic atmosphere.

46. An electron source manufacturing method according to claim 42, wherein said evacuation step includes a pressure reduction step for reducing the pressure of said hermetic atmosphere.

47. An electron source manufacturing method according to claim 46, wherein said processing step includes a gas introducing step for introducing a gas for reducing said member into the pressure-reduced hermetic atmosphere.

48. An electron source manufacturing method according to claim 46, wherein said processing step includes a gas introducing step for introducing hydrogen gas into the pressure-reduced hermetic atmosphere.

49. An electron source manufacturing method according to claim 46, wherein said processing step includes a gas introducing step for introducing a gas containing material of a work function lower than the material forming said member into the pressure-reduced hermetic atmosphere.

50. An electron source manufacturing method according to claim 46, wherein said processing step includes a gas introducing step for introducing carbon gas or a carbon compound gas into the pressure-reduced hermetic atmosphere.

* * * * *

UNITED STATES PATENT AND TRADEMARK OFFICE
CERTIFICATE OF CORRECTION

PATENT NO. : 6,872,112 B2
DATED : March 29, 2005
INVENTOR(S) : Jiro Ota

It is certified that error appears in the above-identified patent and that said Letters Patent is hereby corrected as shown below:

Column 21,
Line 16, "one" should be deleted.

Signed and Sealed this

Eleventh Day of October , 2005

JON W. DUDAS
*Director of the United States Patent and Trademark Office*